(12) United States Patent
Salcedo et al.

(10) Patent No.: US 9,006,781 B2
(45) Date of Patent: Apr. 14, 2015

(54) DEVICES FOR MONOLITHIC DATA CONVERSION INTERFACE PROTECTION AND METHODS OF FORMING THE SAME

(71) Applicant: Analog Devices, Inc., Norwood, MA (US)

(72) Inventors: Javier Alejandro Salcedo, North Billerica, MA (US); Srivatsan Parthasarathy, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/068,869

(22) Filed: Oct. 31, 2013

(65) Prior Publication Data

US 2014/0167105 A1   Jun. 19, 2014

Related U.S. Application Data

(60) Provisional application No. 61/739,645, filed on Dec. 19, 2012, provisional application No. 61/875,450, filed on Sep. 9, 2013.

(51) Int. Cl.
*H01L 27/02* (2006.01)
*H01L 21/8249* (2006.01)

(52) U.S. Cl.
CPC ......... *H01L 27/0262* (2013.01); *H01L 27/0255* (2013.01)

(58) Field of Classification Search
CPC ........... H01L 27/0262; H01L 21/8249; H03K 17/08148; H03K 17/08128
USPC .......................................... 257/140; 438/135
See application file for complete search history.

(56) References Cited

U.S. PATENT DOCUMENTS 3,436,667 A   4/1969   Leonard
4,633,283 A   12/1986   Avery
(Continued)

FOREIGN PATENT DOCUMENTS

| | | |
|---|---|---|
| DE | 10 2007 040 875 A1 | 3/2009 |
| EP | 0 168 678 A2 | 1/1986 |
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Salcedo et al., *Bidirectional Devices for Automotive-Grade Electrostatic Discharge Applications*, IEEE Electron Device Letters, vol. 33, No. 6, Jun. 2012, 3 pages.

(Continued)

*Primary Examiner* — Walter H Swanson
(74) *Attorney, Agent, or Firm* — Knobbe, Martens, Olson & Bear, LLP

(57) ABSTRACT

Apparatus and methods for monolithic data conversion interface protection are provided herein. In certain implementations, a protection device includes a first silicon controlled rectifier (SCR) and a first diode for providing protection between a signal node and a power high supply node, a second SCR and a second diode for providing protection between the signal node and a power low supply node, and a third SCR and a third diode for providing protection between the power high supply node and the power low supply node. The SCR and diode structures are integrated in a common circuit layout, such that certain wells and active regions are shared between structures. Configuring the protection device in this manner enables in-suit input/output interface protection using a single cell. The protection device is suitable for monolithic data conversion interface protection in sub 3V operation.

20 Claims, 16 Drawing Sheets

(56) References Cited

U.S. PATENT DOCUMENTS

| | | | |
|---|---|---|---|
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,541,801 A | 7/1996 | Lee et al. | |
| 5,576,557 A | 11/1996 | Ker et al. | |
| 5,615,074 A | 3/1997 | Avery | |
| 5,652,689 A | 7/1997 | Yuan | |
| 5,663,860 A | 9/1997 | Swonger | |
| 5,742,084 A | 4/1998 | Yu | |
| 5,745,323 A | 4/1998 | English et al. | |
| 5,781,389 A | 7/1998 | Fukuzako et al. | |
| 5,786,617 A | 7/1998 | Merrill et al. | |
| 5,889,644 A | 3/1999 | Schoenfeld et al. | |
| 5,895,840 A | 4/1999 | Ohuchi et al. | |
| 5,895,940 A | 4/1999 | Kim | |
| 5,998,813 A | 12/1999 | Bernier | |
| 6,097,068 A | 8/2000 | Brown et al. | |
| 6,137,140 A | 10/2000 | Efland et al. | |
| 6,144,542 A | 11/2000 | Ker et al. | |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,403,992 B1 | 6/2002 | Wei | |
| 6,404,261 B1 | 6/2002 | Grover et al. | |
| 6,423,987 B1 | 7/2002 | Constapel et al. | |
| 6,512,662 B1 | 1/2003 | Wang | |
| 6,590,273 B2 | 7/2003 | Okawa et al. | |
| 6,621,126 B2 | 9/2003 | Russ | |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,765,771 B2 | 7/2004 | Ker et al. | |
| 6,768,616 B2 | 7/2004 | Mergens et al. | |
| 6,870,202 B2 | 3/2005 | Oka | |
| 6,960,792 B1 | 11/2005 | Nguyen | |
| 6,960,811 B2 | 11/2005 | Wu et al. | |
| 6,979,869 B2 | 12/2005 | Chen et al. | |
| 7,034,363 B2 | 4/2006 | Chen | |
| 7,038,280 B2 | 5/2006 | Righter | |
| 7,071,528 B2 | 7/2006 | Ker et al. | |
| 7,125,760 B1 | 10/2006 | Reese et al. | |
| 7,232,705 B2 | 6/2007 | Righter | |
| 7,232,711 B2 | 6/2007 | Gambino et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,566,914 B2 | 7/2009 | Salcedo et al. | |
| 7,570,467 B2 | 8/2009 | Watanabe et al. | |
| 7,601,991 B2 | 10/2009 | Salcedo et al. | |
| 7,663,190 B2 | 2/2010 | Vinson | |
| 7,714,357 B2 | 5/2010 | Hayashi et al. | |
| 7,834,378 B2 | 11/2010 | Ryu et al. | |
| 7,910,999 B2 | 3/2011 | Lee et al. | |
| 7,969,006 B2 | 6/2011 | Lin et al. | |
| 8,044,457 B2 | 10/2011 | Salcedo et al. | |
| 8,198,651 B2 | 6/2012 | Langguth et al. | |
| 8,222,698 B2 | 7/2012 | Salcedo et al. | |
| 8,331,069 B2 | 12/2012 | Galy et al. | |
| 8,368,116 B2 | 2/2013 | Salcedo et al. | |
| 8,416,543 B2 | 4/2013 | Salcedo | |
| 8,432,651 B2 | 4/2013 | Salcedo et al. | |
| 8,466,489 B2 | 6/2013 | Salcedo et al. | |
| 8,553,380 B2 | 10/2013 | Salcedo | |
| 8,592,860 B2 | 11/2013 | Salcedo et al. | |
| 8,610,251 B1 | 12/2013 | Salcedo | |
| 8,633,509 B2 | 1/2014 | Salcedo | |
| 8,637,899 B2 | 1/2014 | Salcedo | |
| 8,665,571 B2 | 3/2014 | Salcedo et al. | |
| 8,680,620 B2 | 3/2014 | Salcedo et al. | |
| 8,772,091 B2 | 7/2014 | Salcedo et al. | |
| 8,796,729 B2 | 8/2014 | Clarke et al. | |
| 8,860,080 B2 | 10/2014 | Salcedo | |
| 2001/0040254 A1 | 11/2001 | Takiguchi | |
| 2002/0021538 A1 | 2/2002 | Chen et al. | |
| 2002/0081783 A1* | 6/2002 | Lee et al. | 438/133 |
| 2002/0109190 A1 | 8/2002 | Ker et al. | |
| 2002/0122280 A1 | 9/2002 | Ker et al. | |
| 2002/0153571 A1* | 10/2002 | Mergens et al. | 257/358 |
| 2002/0187601 A1 | 12/2002 | Lee et al. | |
| 2003/0038298 A1 | 2/2003 | Cheng et al. | |
| 2003/0076636 A1 | 4/2003 | Ker et al. | |
| 2004/0135229 A1 | 7/2004 | Sasahara | |
| 2004/0164354 A1 | 8/2004 | Mergens et al. | |
| 2004/0190208 A1 | 9/2004 | Levit | |
| 2004/0207021 A1 | 10/2004 | Russ et al. | |
| 2004/0240128 A1 | 12/2004 | Boselli et al. | |
| 2005/0012155 A1 | 1/2005 | Ker et al. | |
| 2005/0082618 A1 | 4/2005 | Wu et al. | |
| 2005/0087807 A1 | 4/2005 | Righter | |
| 2005/0088794 A1 | 4/2005 | Boerstler et al. | |
| 2005/0093069 A1 | 5/2005 | Logie | |
| 2005/0133869 A1* | 6/2005 | Ker et al. | 257/355 |
| 2005/0151160 A1 | 7/2005 | Salcedo et al. | |
| 2005/0195540 A1 | 9/2005 | Streibl et al. | |
| 2006/0033163 A1 | 2/2006 | Chen | |
| 2006/0109595 A1 | 5/2006 | Watanabe et al. | |
| 2006/0145260 A1 | 7/2006 | Kim | |
| 2006/0186467 A1 | 8/2006 | Pendharkar et al. | |
| 2007/0007545 A1 | 1/2007 | Salcedo et al. | |
| 2007/0058307 A1 | 3/2007 | Mergens et al. | |
| 2007/0158748 A1 | 7/2007 | Chu et al. | |
| 2008/0044955 A1 | 2/2008 | Salcedo et al. | |
| 2008/0067601 A1 | 3/2008 | Chen | |
| 2008/0203534 A1 | 8/2008 | Xu et al. | |
| 2009/0032838 A1 | 2/2009 | Tseng et al. | |
| 2009/0034137 A1 | 2/2009 | Disney et al. | |
| 2009/0045457 A1 | 2/2009 | Bodbe | |
| 2009/0057715 A1 | 3/2009 | Ryu et al. | |
| 2009/0206376 A1 | 8/2009 | Mita et al. | |
| 2009/0230426 A1 | 9/2009 | Carpenter et al. | |
| 2009/0236631 A1 | 9/2009 | Chen et al. | |
| 2009/0309128 A1 | 12/2009 | Salcedo et al. | |
| 2010/0133583 A1 | 6/2010 | Mawatari et al. | |
| 2010/0163973 A1 | 7/2010 | Nakamura et al. | |
| 2010/0327343 A1 | 12/2010 | Salcedo et al. | |
| 2011/0101444 A1 | 5/2011 | Coyne et al. | |
| 2011/0110004 A1 | 5/2011 | Maier | |
| 2011/0176244 A1 | 7/2011 | Gendron et al. | |
| 2011/0207409 A1 | 8/2011 | Ker et al. | |
| 2011/0284922 A1 | 11/2011 | Salcedo et al. | |
| 2011/0303947 A1 | 12/2011 | Salcedo et al. | |
| 2011/0304944 A1 | 12/2011 | Salcedo et al. | |
| 2012/0007207 A1 | 1/2012 | Salcedo | |
| 2012/0008242 A1 | 1/2012 | Salcedo | |
| 2012/0199874 A1 | 8/2012 | Salcedo et al. | |
| 2012/0205714 A1 | 8/2012 | Salcedo et al. | |
| 2012/0293904 A1 | 11/2012 | Salcedo et al. | |
| 2013/0032882 A1 | 2/2013 | Salcedo et al. | |
| 2013/0208385 A1 | 8/2013 | Salcedo et al. | |
| 2013/0234209 A1 | 9/2013 | Parthasarathy et al. | |
| 2013/0242448 A1 | 9/2013 | Salcedo et al. | |
| 2013/0270605 A1 | 10/2013 | Salcedo et al. | |
| 2013/0330884 A1 | 12/2013 | Salcedo et al. | |
| 2014/0138735 A1 | 5/2014 | Clarke et al. | |
| 2014/0167104 A1 | 6/2014 | Salcedo | |
| 2014/0167105 A1 | 6/2014 | Salcedo et al. | |
| 2014/0167106 A1 | 6/2014 | Salcedo | |

OTHER PUBLICATIONS

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

(56) References Cited

U.S. PATENT DOCUMENTS

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Chang et al., *High-k Metal Gate-bounded Silicon Controlled Rectifier for ESD Protection*, 34th Electrical Overstress/Electrostatic Discharge Symposium, Sep. 2012, 7 pages.

Salcedo et al., *On-Chip Protection for Automotive Integrated Circuits Robustness*, 2012 8th International Caribbean Conference on Devices, Circuits and Systems (ICCDCS), 5 pages, Mar. 2012.

* cited by examiner

DEVICES FOR MONOLITHIC DATA CONVERSION INTERFACE PROTECTION AND METHODS OF FORMING THE SAME

CROSS-REFERENCE TO RELATED APPLICATIONS

The present application claims priority to U.S. Provisional Patent Application No. 61/739,645, filed Dec. 19, 2012, titled "INTERFACE PROTECTION DEVICE WITH INTEGRATED SUPPLY CLAMP AND METHOD OF FORMING THE SAME," the entirety of which is hereby incorporated herein by reference. The present application also claims priority to U.S. Provisional Patent Application No. 61/875,450, filed Sep. 9, 2013, titled "DEVICES FOR MONOLITHIC DATA CONVERSION INTERFACE PROTECTION AND METHODS OF FORMING THE SAME," the entirety of which is hereby incorporated herein by reference.

This application is related to U.S. application Ser. No. 14/068,566, entitled "SIGNAL IO PROTECTION DEVICES REFERENCED TO SINGLE POWER SUPPLY AND METHODS OF FORMING THE SAME" (Inventors: Javier Alejandro Salcedo and Srivatsan Parthasarathy; the disclosure of which is incorporated herein by reference in its entirety. This application is also related to copending application titled "INTERFACE PROTECTION DEVICE WITH INTEGRATED SUPPLY CLAMP AND METHOD OF FORMING THE SAME," Ser. No. 13/754,200, filed on Jan. 30, 2013, the disclosure of which is hereby incorporated by reference in its entirety herein.

BACKGROUND

1. Field

Embodiments of the invention relate to electronic systems, and more particularly, to monolithic electrostatic discharge (ESD) protection devices in multi-Gigabits/second communication interface applications.

2. Description of the Related Technology

Certain electronic systems can be exposed to a transient electrical event, or an electrical signal of a relatively short duration having rapidly changing voltage and high power. Transient electrical events can include, for example, electrostatic discharge (ESD) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as thin gate oxide punch-through, shallow junction damage, narrow metal damage, and surface charge accumulation.

Moreover, relatively large scale Systems-on-a-Chip (SoCs) for multi-Gigabits/second communication can integrate distributed and multi-level data conversion functionality on an integrated circuit. Such a system can use process technologies such as complementary-metal-oxide-semiconductor (CMOS) technologies that combine a large digital signal processing unit with high speed analog circuits utilizing supply voltages in the range of, for example, about 0.9 V to about 3 V. Large-scale functionality SoCs are particularly prone to fail during manufacturing due to complexity involved in implementing unconventional distributed on-chip protection against electrical overstress without degrading signal integrity. The damage can be caused by overstress such as charged-device-model (CDM) ESD stress conditions, affecting the yield and viability of the reliable system implementation.

There is a need to provide improved protection devices, including protection devices suitable for relatively large scale Systems-on-a-Chip (SoCs) applications.

SUMMARY

In one embodiment, an apparatus is provided. The apparatus includes a substrate, a first semiconductor region of a first doping type in the substrate, a second semiconductor region of a second doping type in the substrate, a third semiconductor region of the first doping type in the substrate, and a fourth semiconductor region of the second doping type in the substrate. The second semiconductor region is positioned between the first and third semiconductor regions, and the third semiconductor region is positioned between the second and fourth semiconductor regions. The apparatus further includes a first diffusion region of the second type in the first semiconductor region, a first gate region adjacent the first semiconductor region, a second diffusion region of the first type in the second semiconductor region, a third diffusion region of the first type in the second semiconductor region, a fourth diffusion region of the second type in the third semiconductor region, a fifth diffusion region of the first type in the fourth semiconductor region, and a second gate region adjacent the fourth semiconductor region. The second diffusion region, the second semiconductor region, the first semiconductor region, and the first diffusion region are configured to operate as a first silicon controlled rectifier (SCR). Additionally, the third diffusion region, the second semiconductor region, the third semiconductor region, and the fourth diffusion region are configured to operate as a second SCR. Furthermore, the fifth diffusion region, the fourth semiconductor region, the third semiconductor region and the fourth diffusion region are configured to operate as a third SCR.

In another embodiment, a method of manufacturing a protection device is provided. The method includes forming a first semiconductor region of a first doping type in a substrate, forming a second semiconductor region of a second doping type in the substrate, forming a third semiconductor region of the first doping type in the substrate, and forming a fourth semiconductor region of the second doping type in the substrate. The second semiconductor region is positioned between the first and third semiconductor regions, and the third semiconductor region is positioned between the second and fourth semiconductor regions. The method further includes forming a first diffusion region of the second type in the first semiconductor region, forming a first gate region adjacent the first semiconductor region, forming a second diffusion region of the first type in the second semiconductor region, forming a third diffusion region of the first type in the second semiconductor region, forming a fourth diffusion region of the second type in the third semiconductor region, forming a fifth diffusion region of the first type in the fourth semiconductor region, and forming a second gate region adjacent the fourth semiconductor region.

DETAILED DESCRIPTION OF EMBODIMENTS

Figure 1:
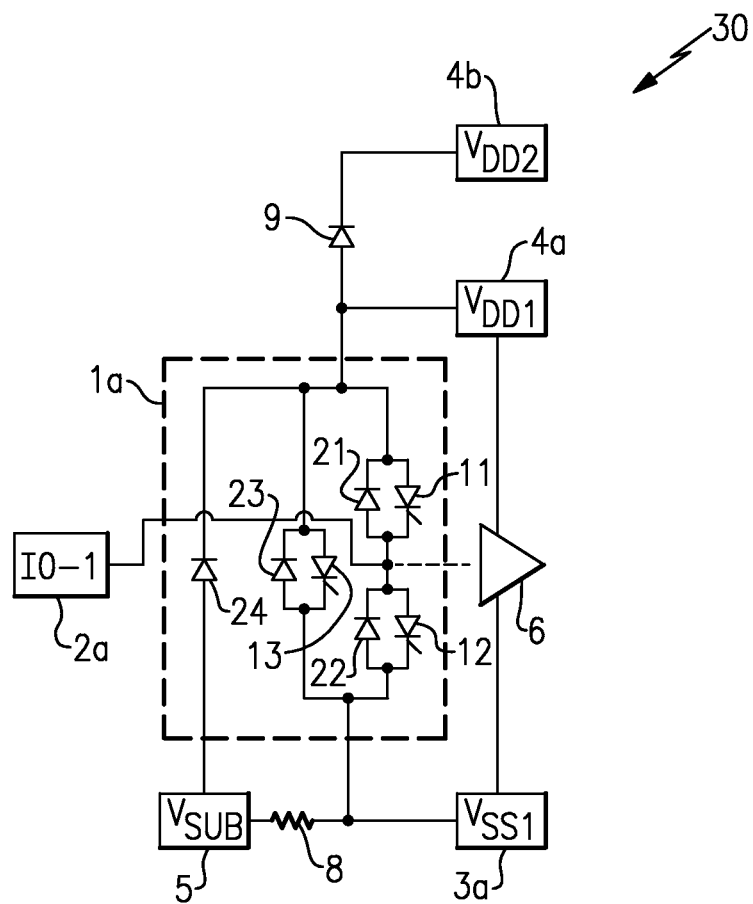
FIG. 1 is a schematic block diagram of one embodiment of an integrated circuit including an interface.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Indeed, the higher dopant concentration regions of semiconductor devices are known as diffusion regions because the dopants tend to at least be partially defined by diffusion and thus by their very nature do not have sharp boundaries. Some boundaries as shown in the accompanying figures are of this type and are illustrated as abrupt structures merely for the assistance of the reader. In the embodiments described below, p-type regions can include a semiconductor material with a p-type dopant, such as boron. Further, n-type regions can include a semiconductor material with an n-type dopant, such as phosphorous. Further, gate dielectric can include insulators, such as high k-dielectric. Further, gates can include conductive regions with variable work functions, such as variable work-function metal or polysilicon. A skilled artisan will appreciate various concentrations of dopants, conductive materials and insulating material can be used in regions described below.

Overview of Monolithic Electrostatic Discharge (ESD) Protection Devices for High Speed Interfaces To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the International Organization for Standardization (ISO). The standards can cover a wide multitude of transient electrical events as discussed above, including electrostatic discharge (ESD) events.

Electronic circuit reliability is enhanced by providing protection devices to the certain nodes of an IC, such as the IC's pins or pads. The protection devices can maintain the voltage level at the nodes within a predefined safe range by transitioning from a high-impedance state to a low-impedance state when the voltage of the transient signal reaches a trigger voltage. Thereafter, the protection device can shunt at least a portion of the current associated with the transient signal to prevent the voltage of the transient signal from reaching a positive or negative failure voltage that is one of the most common causes of IC damage.

Certain protection schemes can use separate protection devices to protect a signal node, such as an input and/or output signal pin, and the IC's power high and power low supplies. For example, separate protection structures having separate physical layouts can be provided between the signal node and the power high supply, between the signal node and the power low supply, and between the power high and power low supplies.

Monolithic ESD protection devices and methods of forming the same are provided herein. In certain implementations, a protection device includes a first silicon controlled rectifier (SCR) and a first diode for providing protection between a signal node and a power high supply node, a second SCR and a second diode for providing protection between the signal node and a power low supply node, and a third SCR and a third diode for providing protection between the power high supply node and the power low supply node. The SCR and diode structures can be integrated in a common circuit layout, such that certain wells and active regions are shared between structures. Configuring the protection device in this manner can reduce the protection circuit's area relative to a configuration where protection structures between the various nodes are implemented in a separate layout. In one embodiment, the protection device provides in-situ input/output interface protection using a single cell.

The protection devices described herein can be used to enhance design flexibility by eliminating a need for separate protection structures between power high and power low supplies. The protection devices can aid in providing an integrated protection solution for ICs fabricated using a variety of processes, including, for example, sub-28-nm high-k metal-gate CMOS processes.

In certain implementations, a protection device is integrated as part of a circuit interface and synthesized with input/output (IO) circuit components for distributed wafer-level package and in-situ ESD protection. Such protection devices can be used, for example, in system-on-a-chip (SoC) multi-gigabit/second analog-to-digital and/or digital-to-analog converters. For example, the teachings herein can enable protection of interface nodes associated with high speed data rate converters. For instance, in one implementation, the protection device can provide protection for clock signal nodes operating at up to about 10 GHz and/or to provide protection for analog-to-digital converter inputs operating between about 2 GHz and about 5 GHz.

In certain configurations, the protection devices can provide protection to a voltage domain having less than or equal to about 3 V, for instance, 0.9 V. The protection device can have relatively constant input/output (IO) capacitance. For example, in one implementation, the protection device has an IO capacitance in the range of about 340 femtofarads (fF) to about 360 fF, thereby reducing the impacts of signal distortion associated with capacitive mismatch and/or parasitic capacitive loading. Additionally, in certain implementations, by reducing device width, the capacitance can be proportionally reduced in value down to about 50 fF, thereby achieving a value suitable for use in certain analog-to-digital (ADC) applications having lower capacitance specifications and a smaller stress current handling capability. In certain configurations, the protection devices can have relatively low standing leakage, such as a leakage of less than about 10 nanoamperes (nA) at 125 degrees Celsius (C). The protection devices can also have relatively fast activation, such as a turn-on or activation time of less than about 100 picoseconds (ps). The protection devices can include complementary protection structures embedded in the protection device's integrated layout to provide on-chip protection against different ESD stress modes.

FIG. 1 is a schematic block diagram of one embodiment of an integrated circuit 30. The integrated circuit or IC 30 includes a first protection circuit 1a, a first signal node 2a (IO−1), a first power low supply node 3a ($V_{SS1}$), a first power high supply node 4a ($V_{DD1}$), a second power high supply node 4b ($V_{DD2}$), a substrate supply node 5 ($V_{SUB}$), a receiver 6, a resistor 8, and a diode 9.

In certain implementations, the signal node 2a, the first power low supply node 3a, the first power high supply node 4a, and/or the substrate supply node 5 can correspond to bond pads of an integrated circuit (IC). However, other configurations are possible, such as implementations in which the IC uses bumps to provide electrical connectivity external to the IC. For example, the teachings herein are applicable to ball grid array (BGA) chip-scale package (CSP) configurations. Other forms of contacts are also applicable, such as pins and leads.

In one embodiment, the nodes can be fabricated using metal stacks optimized to minimize capacitance. For instance, the IO signal node can be via/plug connected up to a sixth metal interconnect layer (metal layer 6, not shown) at the device level, while the first power low supply node 3a and the first power high supply node 4a can be defined at the device level up to a third metal interconnect layer (metal layer 3, not shown), thereby keeping three levels of metal interconnect layers in between the signal and power reference. From the device metallization definition, a well characterized via/plug/metal stack for about optimum current handling capability and low capacitance can be subsequently used to connect to the top metal interconnect layer, from which the different signals can be redistributed by using a redistribution layer (RDL). In certain implementations, the RDL can correspond to a top-most metal layer added used to connect the different system signals to the bumps with relatively small parasitic interaction.

The integrated circuit 30 illustrates one example of an integrated circuit that can include one or more of the protection devices described herein. However, the protection devices can be used in other integrated circuit configurations, including, for example, implementations of integrated circuits using more or fewer protection devices, signal nodes, and/or power high or power low supply nodes.

The illustrated integrated circuit 30 includes multiple power high supply nodes. As shown in FIG. 1, the first power high supply node 4a is electrically connected to the second power high supply node 4b using the diode 9. Providing multiple power high supply nodes can be used to enhance noise isolation between different power domains and/or to permit the power supply domains to operate with different electrical potentials or voltages. Additionally coupling the power high supply nodes in this manner can also aid in providing multiple discharge paths during an ESD event. Although FIG. 1 illustrates the integrated circuit 30 as including one power low supply node 3a, the integrated circuit 30 can include additional power low supply nodes. Thus, the teachings herein are applicable to ICs that include one or more power high supplies and/or one or more power low supplies.

In one embodiment, a voltage difference between the first power high supply node 4a and the first power low supply node 3a is less than or equal to about 0.9 V. However, other configurations are possible.

The first protection circuit 1a can be used to provide transient electrical event protection to the receiver 6 and/or other circuitry of the integrated circuit 30. For example, the first protection circuit 1a can protect from ESD events received between the first signal node 2a and the first power low supply node 3a, between the first signal node 2a and the first power high supply node 4a, and/or between the first power low supply node 3a and the first power high supply node 4a.

The signal node 2 can correspond to a wide variety of signaling nodes, such as input or receive nodes, clock signal nodes, output or transmit nodes, and/or input/output or bidirectional nodes.

The first protection circuit 1a includes a first SCR 11 and a first diode 21 electrically connected in parallel between the first power high supply node 4a and the signal node 2a. The first protection circuit 1a further includes a second SCR 12 and a second diode 22 electrically connected in parallel between the signal node 2a and the first power low supply node 3b. The first protection circuit 1a further includes a third SCR 13 and a third diode 23 electrically connected in parallel between the first power high supply node 4a and the first power low supply node 3a. The first protection circuit 1a further includes a fourth diode 24 electrically connected between the substrate supply node 5 and the first power high supply node 4a.

The first diode 21 can protect against ESD events that cause the voltage of the signal node 2a to increase relative to the voltage of the first power high supply node 4a, and the first SCR 11 can protect against ESD events that cause the voltage of the signal node 2a to decrease relative to the voltage of the first power high supply node 4a. Additionally, the second diode 22 can protect against ESD events that cause the voltage of the signal node 2a to decrease relative to the voltage of the first power low supply node 3a, and the second SCR 12 can protect against ESD events that cause the voltage of the signal node 2a to increase relative to the voltage of the first power low supply node 3a. Additionally, the third diode 23 can protect against ESD events that cause the voltage of the first power high supply node 4a to decrease relative to the voltage of the first power low supply node 3a, and the third SCR 13 can protect against ESD events that cause the voltage of the first power high supply node 4a to increase relative to the voltage of the first power low supply node 3a. As will be described in detail further below, various SCR and diode structures can share wells, diffusion regions, and/or other structures so as to reduce the protection circuit's area relative to a configuration using protection structures implemented in separate circuit layouts.

In the illustrated configuration, the first protection circuit 1a further includes the fourth diode 24, which can be electrically connected in parallel with the third diode 23. Configuring the first protection circuit 1a in this manner can increase the current handling capability of the protection device against ESD events received between the first power high supply node 4a and the first power low supply node 3a. The fourth diode 24 can also help to provide protection to certain guard well or ring structures. However, other configurations are possible.

In certain configurations, a voltage used to bias the substrate can be coupled to one or more of the integrated circuit's power supply domains. For example, in the configuration shown in FIG. 1, the resistor 8 has been electrically connected between the substrate supply node 5 and the first power low supply node 3a. However, other configurations are possible, such as implementations in which the substrate supply node 5 is connected in other ways or implementations in which the substrate supply node 5 is omitted in favor of biasing the substrate using the first power low supply node 3a.

Various embodiments of protection devices that can be used to implement the first protection circuit 1a will be described below. Although the protection devices have been described in the context of the integrated circuit 30 of FIG. 1, the protection devices can be used in other configurations of integrated circuits.

Figure 2A:
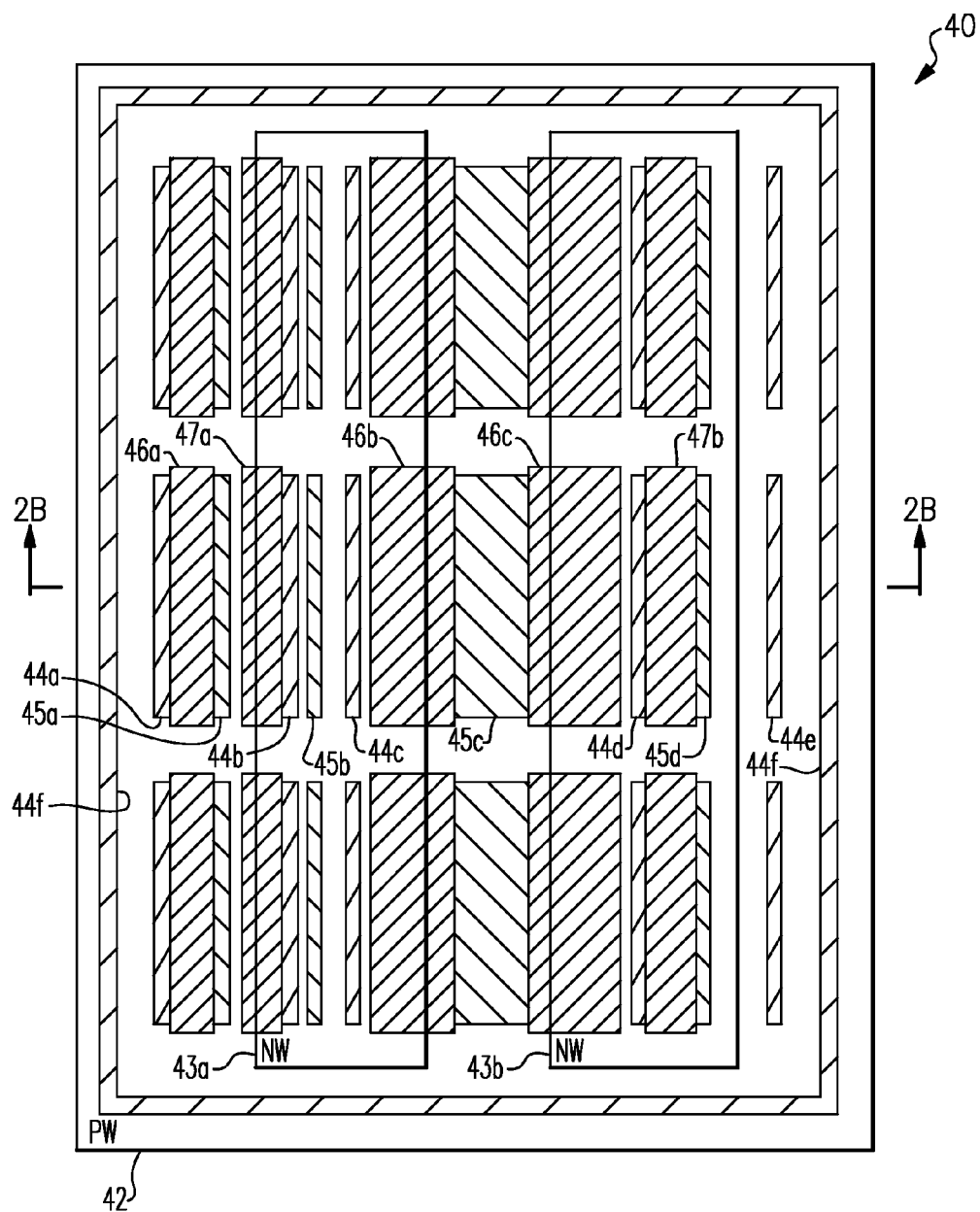
FIG. 2A is a top plan view of a vertically-segmented protection device according to one embodiment.
Figure 2B:
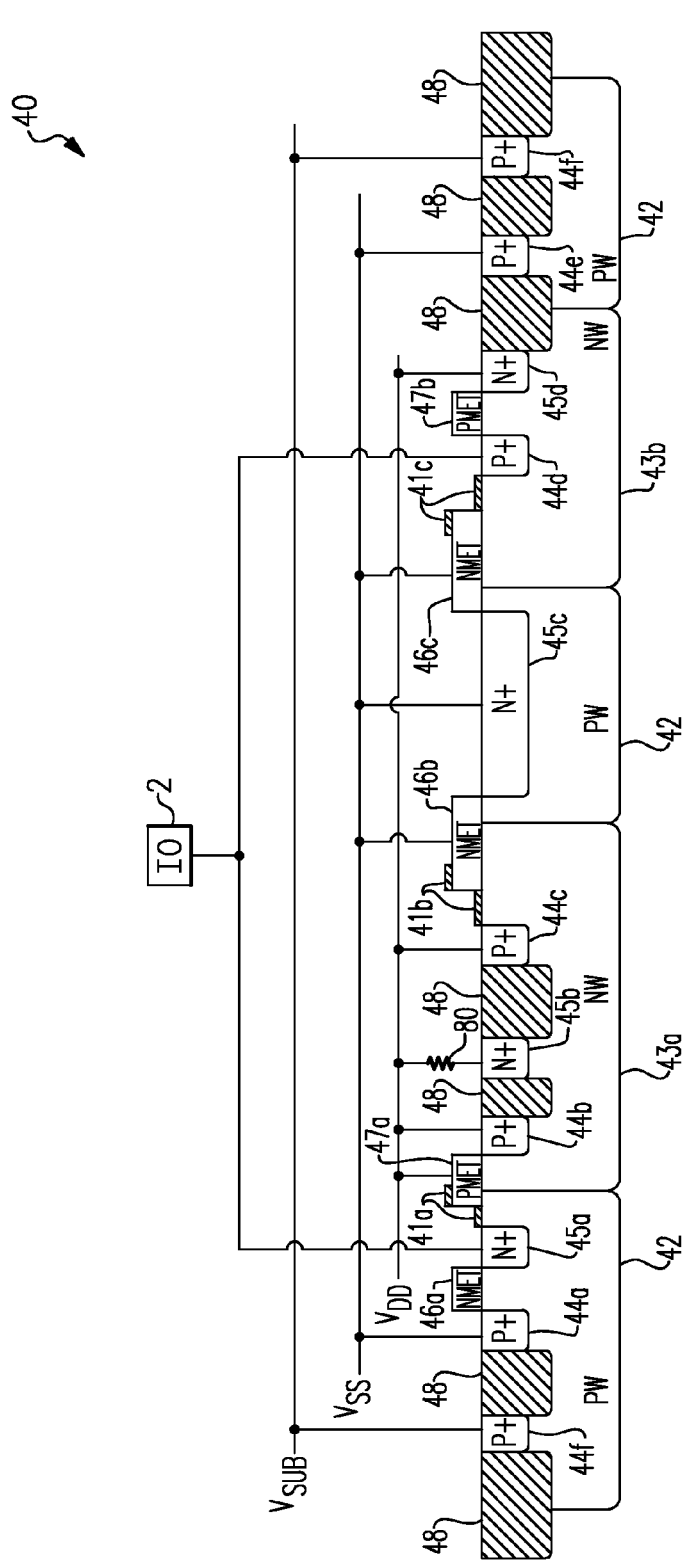
FIG. 2B is a cross section of the protection device of FIG. 2A taken along the lines 2B-2B, which has been annotated to illustrate one implementation of terminal connectivity.
Figure 2C:
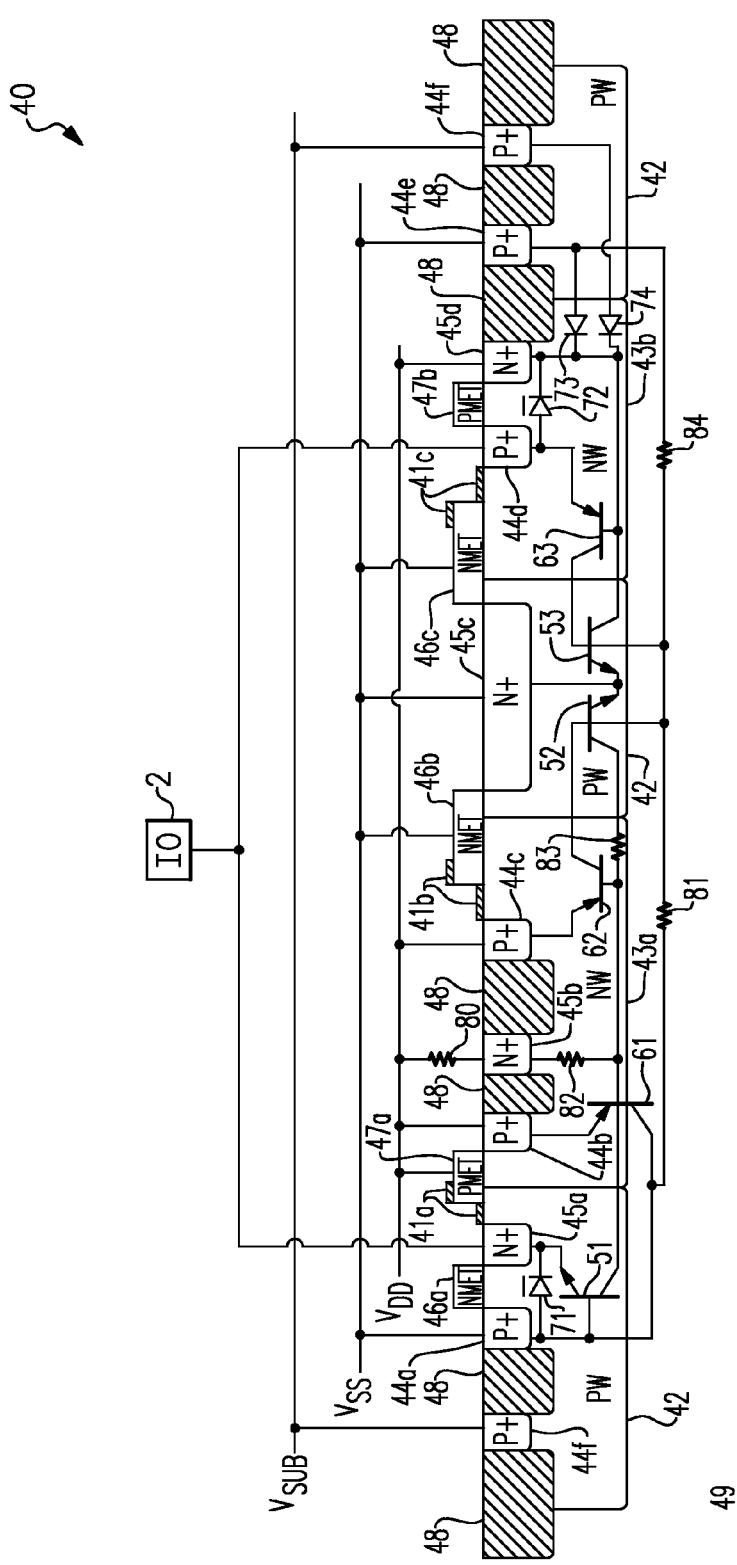
FIG. 2C is an annotated cross section of the protection device of FIG. 2A taken along the lines 2B-2B.

FIG. 2A is a top plan view of a protection device 40 according to one embodiment. FIG. 2B is a cross section of the protection device 40 of FIG. 2A taken along the lines 2B-2B. FIG. 2C is an annotated cross section of the protection device 40 of FIG. 2A taken along the lines 2B-2B.

The protection device 40 includes a p-well 42, a first n-well 43a, a second n-well 43b, first to sixth p-type diffusion or P+ regions 44a-44f, first to fourth n-type diffusion or N+ regions 45a-45d, first to third n-type metal (NMET) gate regions 46a-46c, first and second p-type metal (PMET) gate regions 47a, 47b, oxide regions 48, and first to third resist protective oxide (RPO) regions 41a-41c. For purposes of clarity, the oxide regions 48, the NMET gate regions 46a-46c, the PMET gate regions 47a, 47b, and the RPO regions 41a-41c have been omitted from the top plan view of FIG. 2A. The illustrated protection device 40 is fabricated in a p-type substrate 49. However, the teachings herein are applicable to other types of substrates. For example, the teachings herein are applicable to configurations using an n-type substrate in which the polarity of the illustrated active and well regions uses the opposite doping type.

As shown in FIG. 2A, the p-well 42 is disposed in the p-type substrate 49, and the first and second n-wells 43a, 43b are configured as adjacent islands in the p-well 42. Additionally, the first P+ region 44a and the first N+ region 45a are disposed in a first or left region of the p-well 42, with the first N+ region 45a positioned between the first P+ region 44a and the first n-well 43a. Furthermore, the third N+ region 45c is disposed in a second or central region of the p-well 42. Additionally, the fifth P+ region 44e is disposed in a third or right region of the p-well 42. The second P+ region 44b, the second N+ region 45b, and the third P+ region 44c are disposed in the first n-well 43a. The second P+ region 44b is positioned between the second N+ region 45b and the left region of the p-well 42. Additionally, the second N+ region 45b is positioned between the second and third P+ regions 44b, 44c. Furthermore, the third P+ region 44c is positioned between second N+ region 45b and the central region of the p-well 42. Additionally, the fourth P+ region 44d and the fourth N+ region 45d are disposed in the second n-well 43b, with the fourth P+ region 44d positioned between the fourth N+ region 45d and the central region of the p-well 42. The sixth P+ region 44f has been configured as a ring that surrounds the first and second n-wells 43a, 43b, the first to fourth N+ regions 45a-45d, and the first to fifth P+ regions 44a-44e.

The first NMET gate region 46a is positioned over the left region of the p-well 42, and extends between the first P+ region 44a and the first N+ region 45a. Additionally, the first PMET gate region 47a is positioned over a boundary between the first n-well 43a and the left region of the p-well 42, and extends from the second P+ region 44b toward the first N+ region 45a. Furthermore, the second NMET gate region 46b is positioned over a boundary between the first n-well 43a and the central region of the p-well 42, and extends from the third N+ region 45c toward the third P+ region 44c. Additionally, the third NMET gate region 46c is positioned over a boundary between the second n-well 43b and the central region of the p-well 42, and extends from the third N+ region 45c toward the fourth P+ region 44d. Furthermore, the second PMET gate region 47b is poisoned over the second n-well 43b and extends between the fourth P+ region 44d and the fourth N+ region 45d.

In certain processes, such as high-k metal gate CMOS processes, metals can be used to implement the gates of n-type metal oxide semiconductor (NMOS) and p-type metal oxide semiconductor (PMOS) transistors. Additionally, the composition and/or processing of the gate metal of PMOS transistors and the gate metal of NMOS transistors can be separately configured to achieve work functions corresponding to suitable threshold voltages for NMOS and PMOS transistors. As used herein, PMET gate regions can correspond to a gate metal structure associated with the process's PMOS transistors and NMET gate regions can correspond to a gate metal structure associated with the process's NMOS transistors.

In the illustrated configuration, the protection device 40 includes gates implemented using metals having different work functions. However, other configurations are possible, such as implementations in which the gates are made out of materials that are not metals, such as polysilicon. In certain implementations, the gate regions include a conductive structure and a dielectric structure such as silicon dioxide or a high-k dielectric, for example, in the range of 10 angstroms to 50 angstroms.

The illustrated protection device 40 includes the oxide regions 48. Formation of the oxide or isolation regions 48 can involve etching trenches in the p-type substrate 49, filling the trenches with a dielectric, such as silicon dioxide ($SiO_2$), and removing the excess dielectric using any suitable method, such as chemical-mechanical planarization. In certain implementations, the oxide regions 48 can be shallow trench regions disposed between certain active regions.

As shown in FIG. 2A, certain, wells, active regions, and gate regions extend in a first or vertical direction. Configuring the device in this manner can aid in controlling the flow of current during activation of the protection device 40 in a second or horizontal direction.

In certain configurations, the protection device 40 can be implemented using a plurality of sub-cell segments or building blocks that are connected together to operate as the protection device. For example, in the configuration of FIGS. 2A-2C, the protection device 40 has been implemented using three sub-cell segments replicated in the vertical direction, which can be connected to one another using interconnect layers and contacts and can be configurable via metal mask-only change. In some configurations, the sub-cells can also be arranged next to each other in the horizontal direction for facilitating metal connectivity in implementations in which horizontally-orientated cells align better with the IC die aspect ratio.

Implementing the protection device using sub-cells can aid in providing enhanced performance by providing a structure having enhanced manufacturing process control relative to a single cell configuration. For example, using multiple sub-cells can reduce part-to-part variation in the protection device associated with fine process features or misalignment within manufacturing constraints. Such variation can affect standing leakage, current handling capability, and/or breakdown characteristics. Using multiple sub-cells can reduce variation relative to a configuration using a single sub-cell, which can have a relatively large amount of manufacturing variation in certain processes. Although the protection device 40 has been illustrated as including three sub-cells, the protection device 40 can include more or fewer sub-cells.

As shown in FIG. 2A, the sixth P+ region 44f can be implemented as a ring that surrounds N+ regions, P+ regions, and gate regions associated with each of the sub-cells. The sixth P+ region 44f can operate as a guard ring for reducing the injection of charge from the protection device 40 into the substrate.

In the illustrated configuration, the first RPO region 41a is disposed over a portion of the first PMET gate region 47a and over a surface of the left region of the p-well 42 between the first PMET gate region 47a and the first N+ region 45a. Additionally, the second RPO region 41b is disposed over a portion of the second NMET gate region 46b and over a surface of the first n-well 43a between the second NMET gate region 46b and the third P+ region 44c. Furthermore, the third RPO region 41c is disposed over a portion of the third NMET gate region 46c and over a portion of the second n-well 43b between the third NMET gate region 46c and the fourth P+ region 44d. However, other configurations of RPO regions are possible and/or implementations in which all or part of the RPO regions are omitted.

The RPO regions 41a-41c can be used to prevent local formation of a silicide layer on a surface of the protection device 40 during processing. A silicide layer can have a relatively low resistance, and thus can have a high current density during an ESD event. In certain instances, blocking the silicide formation can further enhance high stress current handling capability, as high currents through the silicide layer and/or close to the semiconductor surface can lead to device damage, such as silicide melting associated with Joule heating and lower melting point of the silicide formation. Accordingly, using the RPO regions 41a-41c to prevent formation of a silicide layer (while silicide is formed on other contact regions) can increase the protection device's robustness during overstress by relatively increasing an amount of current that flows through the protection device's deeper semiconductor regions, such as the protection device's wells and diffusion regions, compared to the absence of the RPO regions.

When the RPO region is omitted, the MOS-formation induces higher standing leakage current in favor of expediting the turn-on speed during stress.

In the illustrated configuration, a separation is provided between an edge of the PMET gate region 47a and an edge of the first N+ region 45a. However, other configurations are possible. For example, the PMET gate region 47a can be extended to eliminate the separation such that PMET gate region 47a and the first N+ region 45a abut. Abutting these two regions can expedite the turn-on of the device during high current stress but can allow a higher MOS-induced standing leakage.

In certain implementations herein, the left region of the p-well 42 can be referred to as a first semiconductor region of the protection device 40, the first n-well 43a can be referred to as a second semiconductor region of the protection device 40, the central region of the p-well 42 can be referred to as a third semiconductor region of the protection device 40, the second n-well 43b can be referred to as a fourth semiconductor region of the protection device 40, and the right region of the p-well 42 can be referred to as a fifth semiconductor region of the protection device 40. Although the protection device 40 illustrates a configuration in which the first to fifth semiconductor regions are implemented as wells, other configurations are possible. For example, in various embodiments described below with reference to FIGS. 10A-11B, one or more of the wells are omitted in favor of using native regions.

Although FIG. 2A illustrates one possible top or plan view of the protection device 40, other configurations are possible, such as configurations including more or fewer sub-cells and/or configurations including a different arrangements of wells, gates, and/or diffusions regions. For example, in one embodiment, the left, center, and right regions of the p-well 42 are implemented using multiple p-wells.

With reference to FIGS. 2B-2C, the cross-sections of the protection device 40 have been annotated to schematically depict various electrical connections between the protection device 40 and the signal node 2, a power high supply node $V_{DD}$, a power low supply node $V_{SS}$, and a substrate supply node $V_{SUB}$. One implementation of electrical connections between the nodes and the device's active regions and gate regions has been schematically depicted in FIGS. 2B-2C. The illustrated electrical connections can be made, for example, using contact and metal layers, such as those associated with metallization or back-end processing.

In the illustrated configuration, the first NMET gate region 46a and the second PMET gate region 47b are electrically floating. The first NMET gate region 46a and the second PMET gate region 47b do not operate as gates of metal oxide semiconductor (MOS) transistors in this configuration, since areas of different doping polarities are on opposing sides of the gate regions. However, the first NMET gate region 46a and the second PMET gate region 47b have been advantageously used to operate as implant blocking regions to allow more uniform current conduction and faster response during transient stress conditions.

The second and third NMET gate regions 46b, 46c and the first PMET gate region 47a can be associated with MOS transistor structures, as will be described in further detail below with reference to FIG. 3.

The substrate supply node $V_{SUB}$ has been electrically connected to the sixth P+ region 44f, which in certain implementations can be positioned along an outer perimeter of the protection device 40 to operate as a guard ring. Connecting the substrate supply node $V_{SUB}$ to the sixth P+ region 44f can reduce carrier injection and/or the risk of latch-up when the protection device is integrated on-chip. In one embodiment, the sixth P+ region 44f is Kelvin-connected to a power low supply node such as $V_{SS}$ that controls the voltage of the substrate supply node $V_{SUB}$. For example, the sixth P+ region 44f can be connected such that a resistance between the sixth P+ region 44f and the substrate supply node $V_{SUB}$ is greater than a resistance between the p-type substrate 49 and the power low supply node $V_{SS}$. Although the protection device 40 is illustrated as including both the substrate supply node $V_{SUB}$ and the power low supply node $V_{SS}$, other configurations are possible, including, for example, implementations in which the substrate supply $V_{SUB}$ is omitted in favor of electrically connecting the sixth P+ region 44f to the power low supply node $V_{SS}$.

The protection device 40 of FIG. 2C has been annotated to show certain equivalent circuit devices formed from the illustrated structure, such as a first NPN bipolar transistor 51, a second NPN bipolar transistor 52, a third NPN bipolar transistor 53, a first resistor 81, a second resistor 82, a third resistor 83, a fourth resistor 84, a first PNP bipolar transistor 61, a second PNP bipolar transistor 62, a third PNP bipolar transistor 63, a first diode 71, a second diode 72, a third diode 73, and a fourth diode 74. For clarity, certain circuit devices have been omitted from FIG. 2C, such as certain MOS transistor structures, which will be described below with reference to FIG. 3. The protection device 40 of FIG. 2C has also been illustrated to include the resistor 80, which can be an explicit resistor provided in certain implementations to provide additional resistance between the second N+ region 45b and the power high supply node $V_{DD}$.

The resistor 80 can be implemented in any suitable manner, such as by using a resistive material having a geometry selected to achieve the desired resistance. In one embodiment, the resistor 80 has a resistance selected to be in the range of about 100Ω to about 10 kΩ. In certain implementations, the resistor 80 can be implemented using n-type and/or p-type poly resistor structures integrated within the device formation footprint.

The first NPN bipolar transistor 51 includes an emitter associated with the first N+ region 45a, a base associated with the left region of the p-well 42, and a collector associated with the first n-well 43a. The second NPN bipolar transistor 52 includes an emitter associated with the third N+ region 45c, a base associated with the central region of the p-well 42, and a collector associated with the first n-well 43a. The third NPN bipolar transistor 53 includes an emitter associated with the third N+ region 45c, a base associated with the central region of the p-well 42, and a collector associated with the second n-well 43b. The first PNP bipolar transistor 61 includes an emitter associated with the second P+ region 44b, a base associated with the first n-well 43a, and a collector associated with the left region of the p-well 42. The second PNP bipolar transistor 62 includes an emitter associated with the third P+ region 44c, a base associated with the first n-well 43a, and a collector associated with the central region of the p-well 42. The third PNP bipolar transistor 63 includes an emitter associated with the fourth P+ region 44d, a base associated with the second n-well 43b, and a collector associated with the central region of the p-well 42.

The first diode 71 includes a cathode associated with the first N+ region 45a and an anode associated with the first P+ region 44a and the left region of the p-well 42. The second diode 72 includes an anode associated with the fourth P+ region 44d and a cathode associated with the fourth N+ region 45d and the second n-well 43b. The third diode 73 includes an anode associated with the fifth P+ region 44e and the right region of the p-well 42 and a cathode associated with the second n-well 43b and the fourth N+ region 45d.

The first and second diodes 71, 72 include a metal gate structure over the diode's p-n junction interface. For example, in the illustrated configuration, an edge of the first NMET gate region 46a is positioned over a boundary between the first N+ region 45a and the left region of the p-well 42, and an edge of the second PMET gate region 47b is positioned over a boundary between the fourth P+ region 44d and the second n-well 43b.

Such diodes can be referred to herein as a "gated diode," which can provide enhanced conductivity relative to certain conventional diode structures. For example, during an ESD event, forward-diode conduction can be closer to the surface of the gated diode relative to a conventional diode structure. Additionally, the anode and cathode regions of the gated diode can be formed closer to each other, thereby decreasing the diode's resistance and minimizing diode forward recovery. Using one or more gated diodes can result in lower voltage overshot during stress conditions.

The first resistor 81 is associated with a resistance of the p-well 42 and the substrate 49 between the first P+ region 44a and the bases of the second and third NPN bipolar transistors 52, 53. The second resistor 82 is associated with a resistance of the first n-well 43a between the second N+ region 45b and the bases of the first and second PNP bipolar transistors 61, 62. The third resistor 83 is associated with a resistance of the first n-well 43a between the base of the second PNP bipolar transistor 62 and the collector of the second NPN bipolar transistor 52. The fourth resistor 84 is associated with a resistance of the p-well 42 and the substrate 49 between the fifth P+ region 44e and the bases of the second and third NPN bipolar transistors 52, 53.

Figure 3:
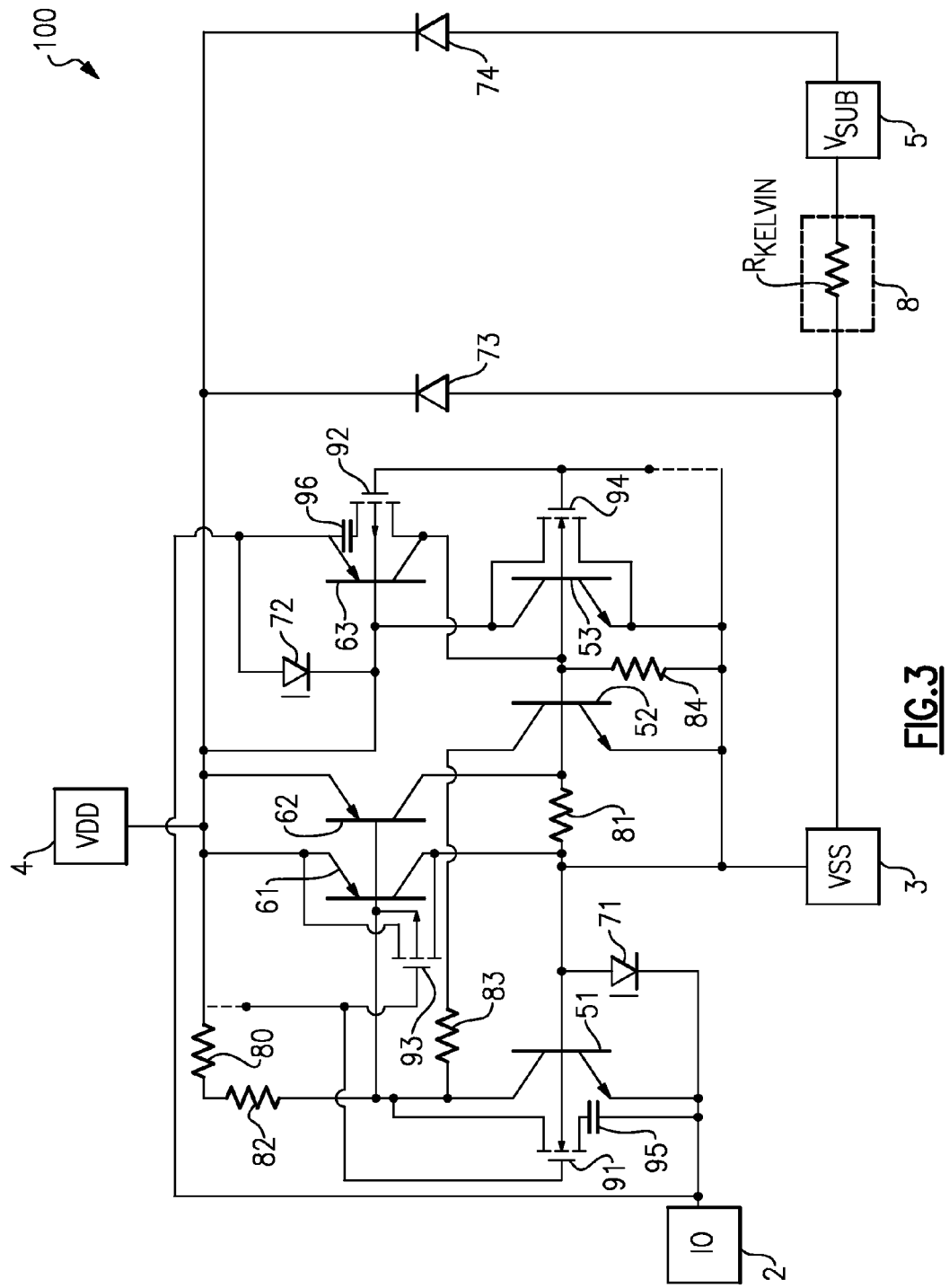
FIG. 3 is a circuit diagram of the protection device of FIGS. 2A-2C.

FIG. 3 is a circuit diagram 100 of the protection device 40 of FIGS. 2A-2C. The circuit diagram 100 includes the NPN bipolar transistors 51-53, the PNP bipolar transistors 61-63, the diodes 71-74, and the resistors 80-84, which can be as described earlier. The circuit diagram 100 illustrates various connections between the components and the signal node 2, the power high supply $V_{DD}$, the power low supply $V_{SS}$, and the substrate supply node $V_{SUB}$.

The circuit diagram 100 illustrates one implementation of the first protection circuit 1a of FIG. 1. For example, the first NPN bipolar transistor 51 and the first PNP bipolar transistor 61 can operate as the first SCR 11, the second NPN bipolar transistor 52 and the second PNP bipolar transistor 62 can operate as the second SCR 12, and the third NPN bipolar transistor 53 and the third PNP bipolar transistor 63 can operate as the third SCR 13. Furthermore, the first to fourth diodes 71-74 of FIG. 3 can operate as the first to fourth diodes 21-24, respectively, of FIG. 1. Additional structures of FIG. 1, such as the resistor 8 have been illustrated in FIG. 3.

The circuit diagram 100 further includes first and second NMOS transistors 91, 94, first and second PMOS transistors 92, 93, and first and second standing current conduction blocking regions 95, 96.

With reference to FIGS. 2C and 3, the first NMOS transistor 91 can have a source associated with the first N+ region 45a, a drain associated with the first n-well 43a, a gate associated with the first PMET gate region 47a, and a body associated with the left region of the p-well 42. As shown in FIG. 2C, a spacing or separation has been provided between the first N+ region 45a and an edge of the first PMET gate region 47a. The separation can operate to provide the first standing current conduction blocking region 95 between the source of the first NMOS transistor 91 and the signal node 2. During an ESD event, a displacement current can flow through the first standing current conduction blocking region 95 and the first NMOS transistor 91, thereby reducing the device's on-state resistance. Providing the separation can further operate to reduce the static leakage current of the first NMOS transistor 91 relative to a configuration in which the first N+ region 45a and the edge of the PMET gate region 47a abut. Additionally, the first NMOS transistor 91 has been implemented using a gate including PMET, which can operate to increase the first NMOS transistor's threshold voltage and to reduce leakage current relative to a configuration using NMET.

The second NMOS transistor 94 includes a source associated with the third N+ region 45c, a drain associated with the second n-well 43b, a gate associated with the third NMET gate region 46c, and a body associated with the central region of the p-well 42. The second NMOS transistor 94 can enhance protection against an ESD event received between the power high supply node $V_{DD}$ and the power low supply node $V_{SS}$.

The first PMOS transistor 92 includes a source associated with the fourth P+ region 44d, a drain associated with the central region of the p-well 42, a gate associated with the third NMET gate region 46c, and a body associated with second n-well 43b. As shown in FIG. 2C, a separation has been provided between the fourth P+ region 44d and an edge of the third NMET gate region 46c. The separation can operate to provide the second standing current conduction blocking region 96 between the source of the first PMOS transistor 92 and the signal node 2. Providing the separation can operate to reduce static leakage current of the first PMOS transistor 92 relative to a configuration in which the fourth P+ region 44d and the edge of the third NMET gate region 46c abut. The first PMOS transistor 92 can enhance protection against an ESD event received between the signal node 2 and the power low supply node $V_{SS}$.

The second PMOS transistor 93 includes a source associated with the second P+ region 44b, a drain associated with the left region of the p-well 42, a gate associated with the first PMET gate region 47a, and a body associated with the first n-well 43a. The second PMOS transistor 93 can enhance protection against an ESD event that decreases the voltage of the power high supply node $V_{DD}$ relative to the first power low supply node $V_{SS}$.

Figure 4:
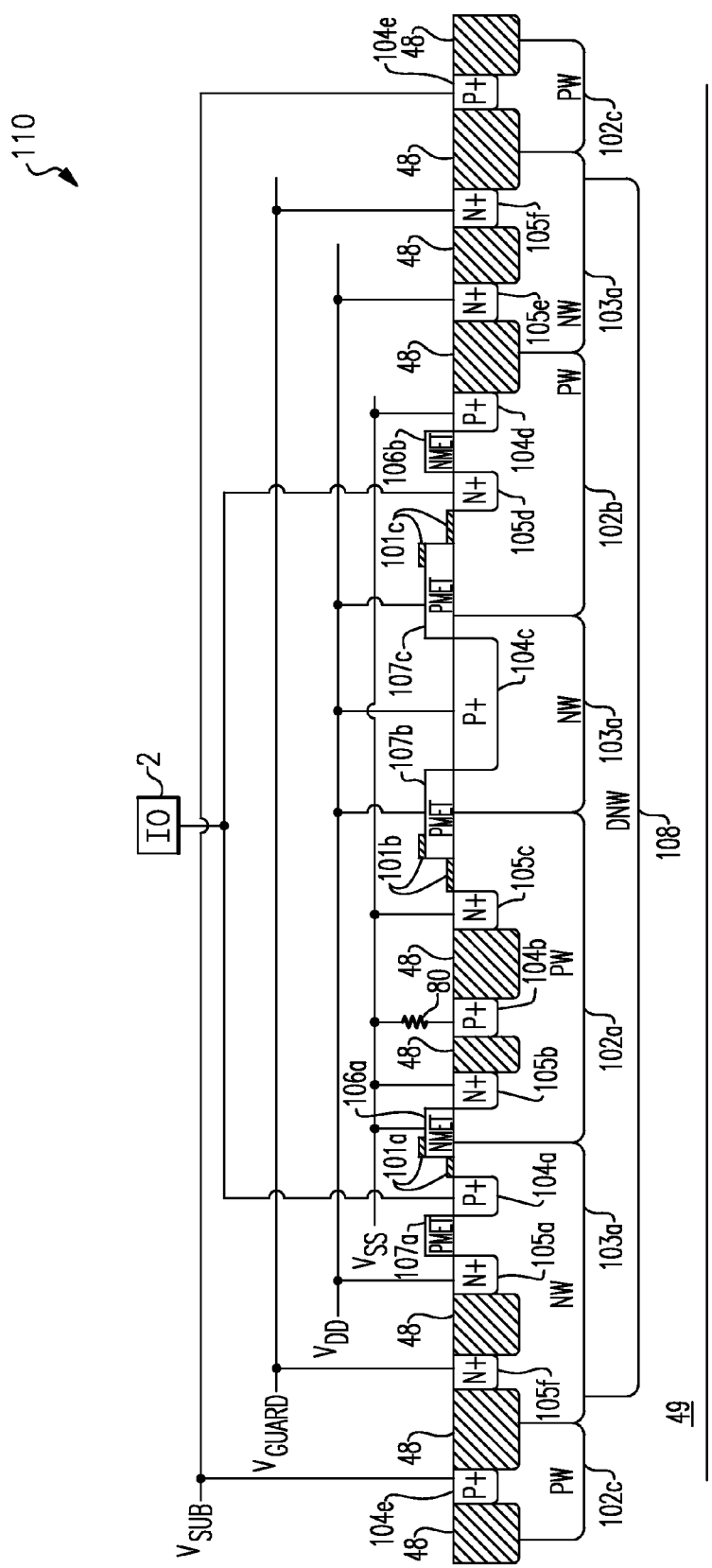
FIG. 4 is a cross section of a protection device according to another embodiment.

FIG. 4 is a cross section of a protection device 110 according to another embodiment. The protection device 110 includes an n-well 103a, first to third p-wells 102a-102c, a deep n-well 108, first to third RPO regions 101a-101c, first to fifth P+ regions 104a-104e, first to sixth N+ regions 105a-105f, first and second NMET gate regions 106a, 106b, first to third PMET gate regions 107a-107c, and oxide regions 48. The protection device 110 is fabricated in the p-type substrate 49.

The protection device 110 of FIG. 4 is similar to the protection device 40 of FIGS. 2A-2C, except that the doping of the wells and diffusion regions have been reversed so as to provide a protection device of a complementary polarity and isolate the different device regions from the substrate. For example, the n-well 103a of FIG. 4 can correspond to the p-well 42 of FIGS. 2A-2C but with polarity reversed, and the first and second p-wells 102a, 102b of FIG. 4 can correspond to the first and second n-wells 43a, 43b, respectively, of FIGS. 2A-2C, but with polarity reversed. Similarly, the first to sixth N+ regions 105a-105f of FIG. 4 can correspond to the first to sixth P+ regions 44a-44f, respectively, of FIGS. 2A-2C, but with polarity reversed Likewise, the first to fourth P+ regions 104a-104d of FIG. 4 can correspond to the first to fourth N+ regions 45a-45d, respectively, of FIGS. 2A-2C, respectively, but with polarity reversed. Furthermore, the first and second NMET gate regions 106a, 106b of FIG. 4 can correspond to the first and second PMET gate regions 47a, 47b, respectively, of FIGS. 2A-2C, but with polarity reversed. Additionally, the first to third PMET gate regions 107a-107c of FIG. 4 can correspond to the first to third NMET gate regions 46a-46c, respectively, of FIGS. 2A-2C, but with polarity reversed. Furthermore, the first to third RPO regions 101a-101c of FIG. 4 can correspond to the first to third RPO regions 41a-41c, respectively, of FIGS. 2A-2C.

Relative to the protection device 40 of FIGS. 2A-2C, the protection device 110 of FIG. 4 further includes the fifth P+ region 104e, the third p-well 102c, and the deep n-well 108.

The fifth P+ region 104e and the third p-well 102c can be configured to surround a perimeter of the protection device 110, and can operate as a guard ring to reduce carrier injection into the p-type substrate 49 to enhance latch-up robustness. The deep n-well 108 has been positioned beneath the n-well 103a and the first and second p-wells 102a, 102b, and can be used to electrically isolate the first and second p-wells 102a, 102b from the p-type substrate 49.

To maintain proper junction biasing, the electrical connections between the protection device 110 of FIG. 4 and the power high and low supply nodes $V_{DD}$, $V_{SS}$ have been reversed relative to the configuration of FIGS. 2A-2C.

Additional details of the protection device 110 can be similar to those described earlier.

Figure 5A:
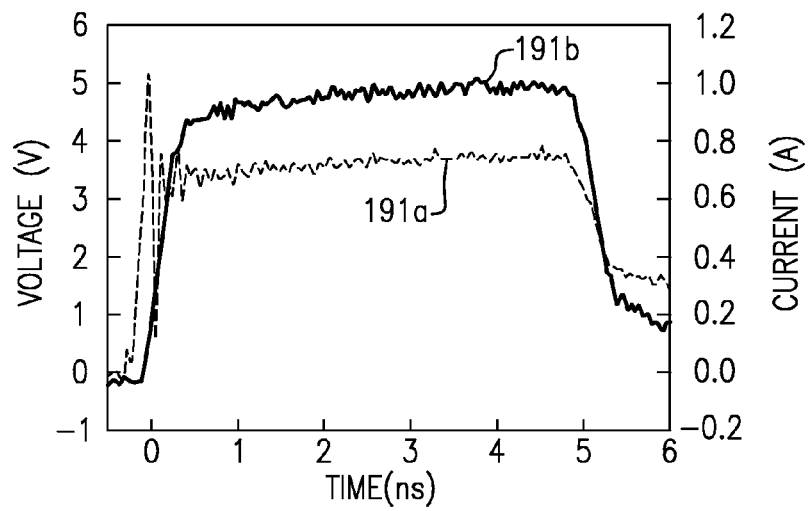
FIGS. 5A-5C are examples of graphs of current and voltage versus time for various stress conditions of a protection device according to one embodiment.
Figure 5B:
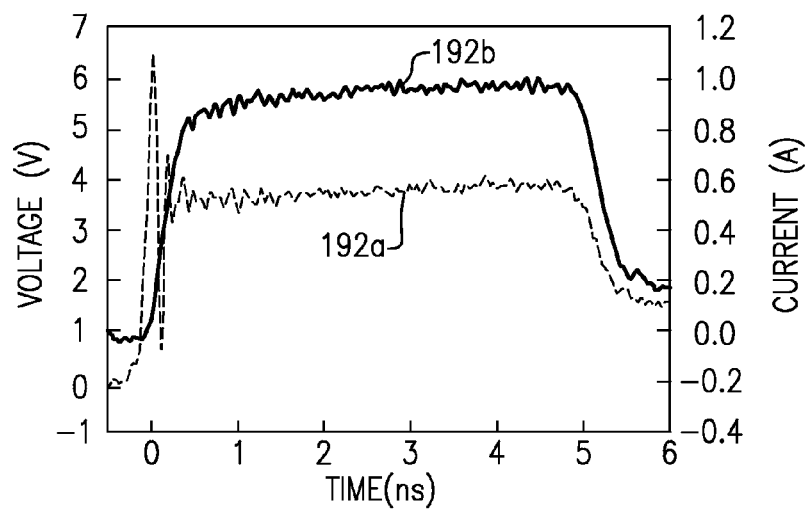
Figure 5C:
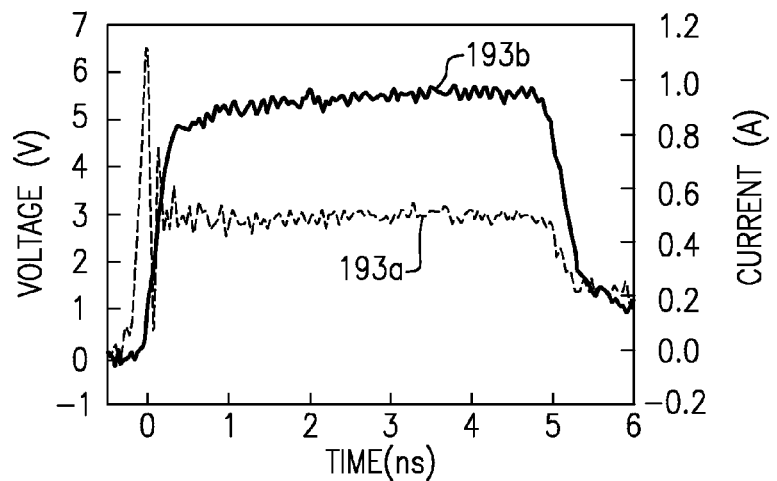

FIGS. 5A-5C are examples of graphs of current and voltage versus time for various stress conditions of a protection device according to one embodiment. The data corresponds to transmission line pulsing (TLP) data for one implementation of the protection device 40 of FIGS. 2A-2C. Although one example of data has been shown, other data is possible, such as data associated with a particular layout implementation and/or process used to fabricate the protection device.

FIG. 5A corresponds to a graph of IO to VSS transient response for a 1 amp very-fast-transmission-line (vftlp) stress condition having about a 300 ps rise time and a pulse width of about 5 ns. FIG. 5A includes a voltage waveform 191a and a current waveform 191b. As shown in FIG. 5A, the illustrated configuration has an overshoot voltage between about 4.5 V and 6 V for less than about 65 ps.

FIG. 5B corresponds to a graph of VDD to IO transient response for a stress condition similar to that described above with reference to FIG. 5A. The graph includes a voltage waveform 192a and a current waveform 192b. The illustrated configuration has an overshoot voltage between about 4.5 V and 7 V for less than about 65 ps.

FIG. 5C corresponds to a graph of VDD to VSS transient response for a stress condition similar to that described above with reference to FIG. 5A. The graph includes a voltage waveform 192a and a current waveform 192b. The illustrated configuration has an overshoot voltage between about 4.5 V and 7 V for less than about 65 ps.

Figure 6:
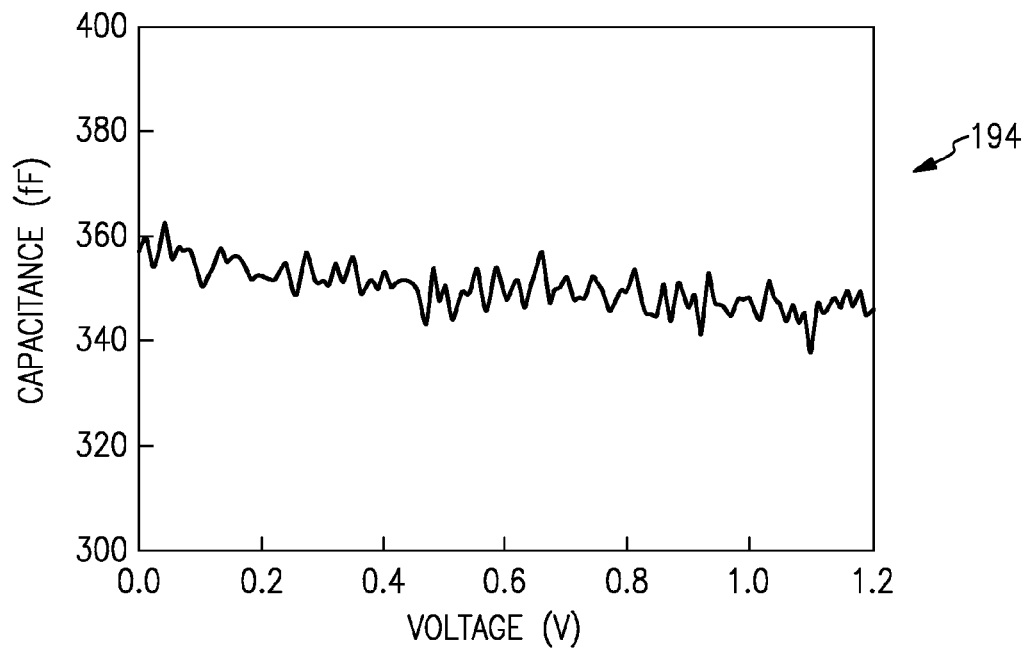
FIG. 6 is a graph of one example of capacitance versus voltage for a protection device according to one embodiment.

FIG. 6 is a graph 164 of one example of capacitance versus voltage for a protection device according to one embodiment. The data corresponds to capacitance data for one implementation of the protection device 40 of FIGS. 2A-2C with 6 segments/5-μm wide each of them, for a total of 30 μm in width.

The graph 164 is taken for various amounts of voltage difference between power high and power low supply voltages. As shown in FIG. 6, the capacitance can be in the range of amount 340 fF to about 360 fF, including metallization. The relatively small amount of parasitic capacitance can be further reduced by disconnecting segments of the device via metal change. The relatively small amount of parasitic capacitance can result in the protection device having a relatively small impact on signal distortion of signals transmitted or received on the signal node.

Although one example of capacitance data has been shown, capacitance data can vary depending on a variety of factors. For example, the amount of capacitance can depend in part on a size and or number of sub-cells (see the top plan view of FIG. 2A) used to implement the protection device. For example, in one embodiment, a width of each sub-cell can be in the range of about 10 μm to about 40 μm, and a height of each sub-cell can be in the range of about 4 μm to about 8 μm, and an overall capacitance on the signal node can be in the range of about 70 fF to about 400 fF. However, other configurations are possible.

Figure 7:
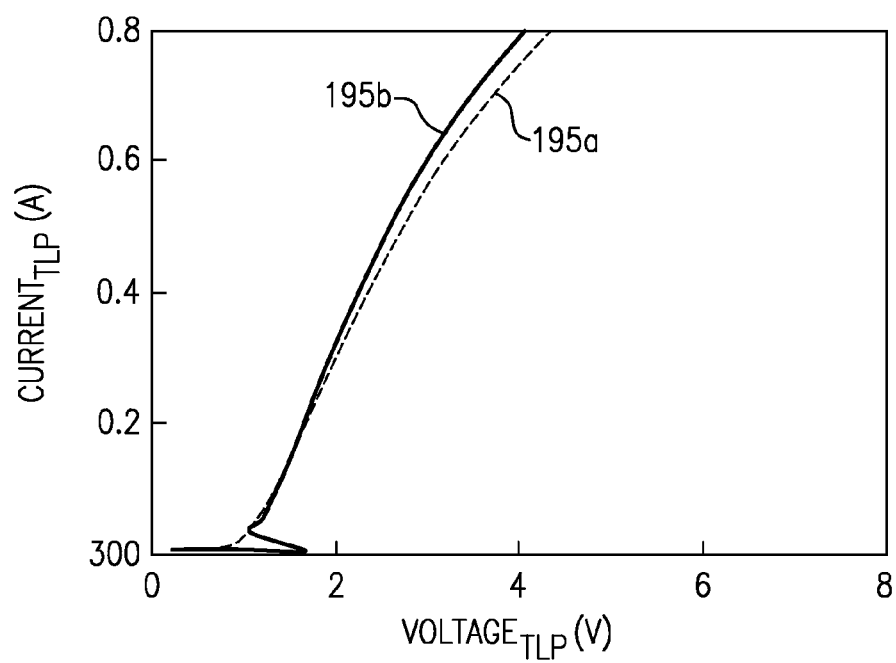
FIG. 7 is a graph of one example of transmission-line pulsing current versus voltage data for a protection device according to one embodiment.

FIG. 7 is a graph of one example of transmission-line pulsing current versus voltage data for a protection device according to one embodiment. The data can correspond to TLP data for one implementation of the protection device 40 of FIGS. 2A-2C. However, other results are possible.

The graph includes a first plot 195*a* of the forward-biased diode for IO to VDD stress and a second plot 195*b* in response of the SCR—like structure to the IO to VSS stress. The first and second plots 195*a*, 195*b* correspond to measurements associated with a TLP pulse having about a 600 ps rise time and about a 100 ns width. As shown in FIG. 7, the protection device can have a TLP current handling capability in the range of about 1 A to about 1.5 A and trigger voltage under about 2 V in the IO to VSS stress condition.

Figure 8A:
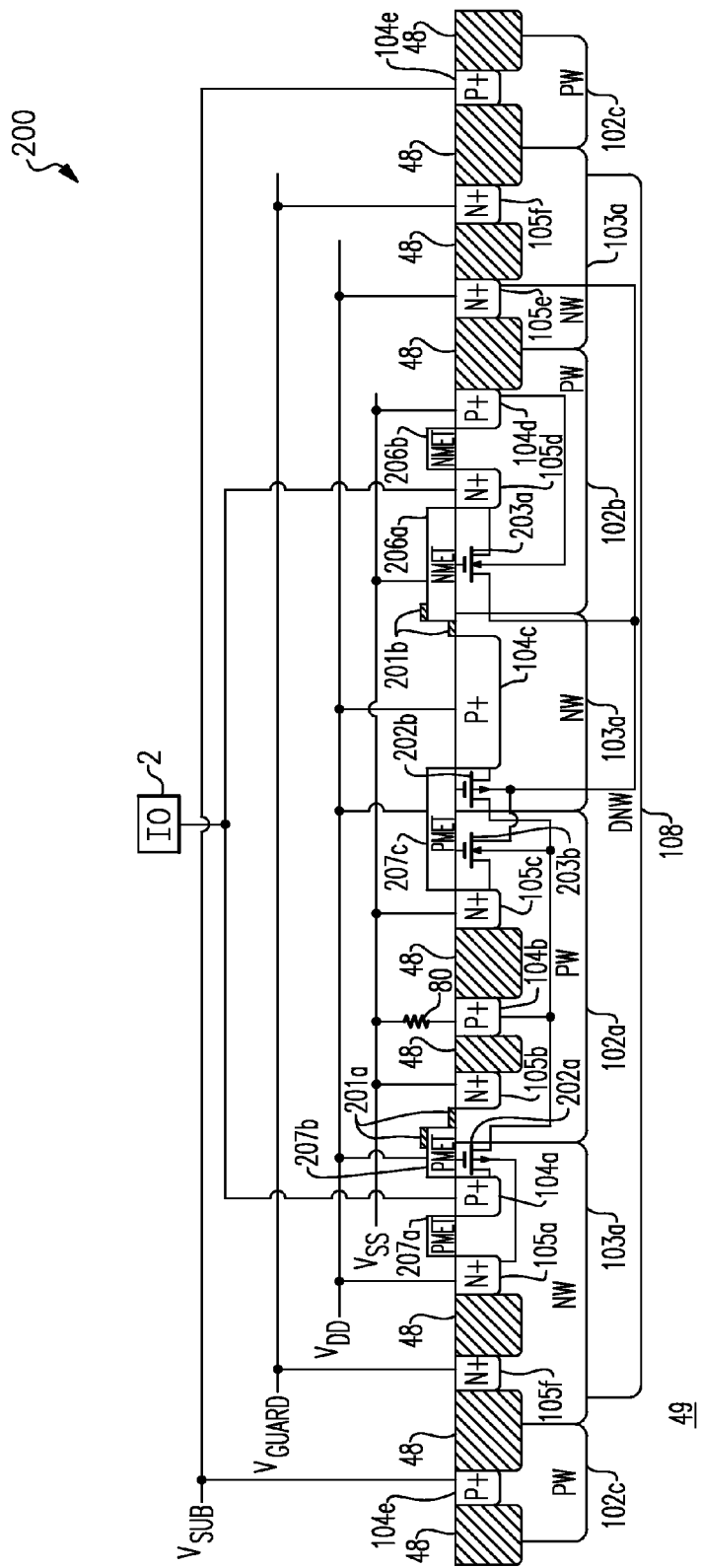
FIG. 8A is a cross section of a protection device according to another embodiment.

FIG. 8A is a cross section of a protection device 200 according to another embodiment. The protection device 200 includes the n-well 103*a*, first to third p-wells 102*a*-102*c*, the deep n-well 108, first and second RPO regions 201*a*, 201*b*, first to fifth P+ regions 104*a*-104*e*, first to sixth N+ regions 105*a*-105*f*, first and second NMET gate regions 206*a*, 206*b*, first to third PMET gate regions 207*a*-207*c*, and oxide regions 48. The protection device 110 is fabricated in the p-type substrate 49.

The protection device 200 of FIG. 8A is similar to the protection device 110 of FIG. 4, except that the protection device 200 includes a different arrangement of gate regions and RPO regions.

For example, as shown in FIG. 8A, the first PMET gate region 207*a* is positioned over the left region of the n-well 103*a* and extends between the first N+ region 105*a* and the first P+ region 104*a*. Additionally, the second PMET gate region 207*b* is positioned over a boundary between the first p-well 102*a* and the left region of the n-well 103*a*, and extends from the first P+ region 104*a* toward the second N+ region 105*b*. As shown in FIG. 8A, the first RPO region 201*a* is disposed over a portion of the second PMET gate region 207*b* and over a surface of the first p-well 102*a* between the second PMET gate region 207*b* and the second N+ region 105*b*. Additionally, the third PMET gate region 207*c* is positioned over a boundary between the first p-well 102*a* and the central region of the n-well 103*a*, and extends between the third N+ region 105*c* and the third P+ region 104*c*. Furthermore, the first NMET gate region 206*a* is positioned over a boundary between the second p-well 102*b* and the central region of the n-well 103*a*, and extends from the fourth N+ region 105*d* toward the third P+ region 104*c*. As shown in FIG. 8A, the second RPO region 201*b* is disposed over a portion of the first NMET gate region 206*a* and over a surface of the central region of the n-well 103*a* between the first NMET gate region 206*a* and the third P+ region 104*c*. Additionally, the second NMET gate region 206*b* is positioned over the second p-well 102*b*, and extends between the fourth N+ region 105*d* and the fourth P+ region 104*d*. In the illustrated configuration, the first PMET gate region 207*a* and the second NMET gate region 206*b* are electrically floating. Additionally, the second PMET gate region 207*b* and the third PMET gate region 207*c* are electrically connected to the power high supply $V_{DD}$, and the first NMET gate region 206*a* is electrically connected to the power low supply $V_{SS}$.

The protection device 200 has been annotated to include first and second PMOS transistors 202*a*, 202*b* and first and second NMOS transistors 203*a*, 203*b*. The first PMOS transistor 202*a* includes a source, drain, gate, and body associated with the first P+ region 104*a*, the first p-well 102*a*, the second PMET gate region 207*b*, and the n-well 103*a*, respectively.

The first NMOS transistor 203*a* includes a source, drain, gate, and body associated with the fourth N+ region 105*d*, the central region of the n-well 103*a*, the first NMET gate region 206*a*, and the second p-well 102*b*, respectively. The second PMOS transistor 202*b* includes a source, drain, gate, and body associated with the third P+ region 104*c*, the first p-well 102*a*, the third PMET gate region 207*c*, and the central region of the n-well 103*a*, respectively. The second NMOS transistor 203*b* includes a source, drain, gate, and body associated with the third N+ region 105*c*, the central region of the n-well 103*a*, the third PMET gate region 207*c*, and the first p-well 102*a*, respectively.

Although FIG. 8A has been annotated to illustrate certain devices, the protection device 200 includes additional devices, including, for example, bipolar transistors that operate in silicon controlled rectifiers (SCRs) as was described earlier. Such details have been omitted from FIG. 8A for clarity.

The first RPO region 201*a* provides a separation between an edge of the second PMET gate region 207*b* and the second N+ region 105*b*, and can be used to prevent formation of an NMOS transistor having a source, drain, and gate associated with the second N+ region 105*b*, the left region of the n-well 103*a*, and the second PMET gate region 207*b*, respectively. Additionally, the second PMET gate region 207*b* is electrically connected to the power high supply $V_{DD}$, which can operate to turn off the first PMOS transistor 202*a* during normal signaling conditions. However, during an ESD event between the signal node 2 and the power low supply node $V_{SS}$, the first PMOS transistor 202*a* can activate to enhance the protection device's current handling capability and/or turn-on speed.

Additionally, the second RPO region 201*b* provides a separation between an edge of the first NMET gate region 206*a* and the third P+ region 104*c*, and can be used to prevent formation of a PMOS transistor having a source, drain, and gate associated with the third P+ region 104*c*, the second p-well 102*b*, and the first NMET gate region 206*a*, respectively. Additionally, the second NMET gate region 206*b* is electrically connected to the power low supply $V_{SS}$, which can operate to turn off the first NMOS transistor 203*a* during normal signaling conditions. However, during an ESD event between the signal node 2 and the power high supply node $V_{DD}$, the first NMOS transistor 203*a* can activate to aid in providing ESD protection.

In the illustrated configuration, the second NMOS transistor 203*b* and the second PMOS transistor 202*b* can turn on and conduct during ESD events received between the power low supply $V_{SS}$ and the power high supply $V_{DD}$.

Figure 8B:
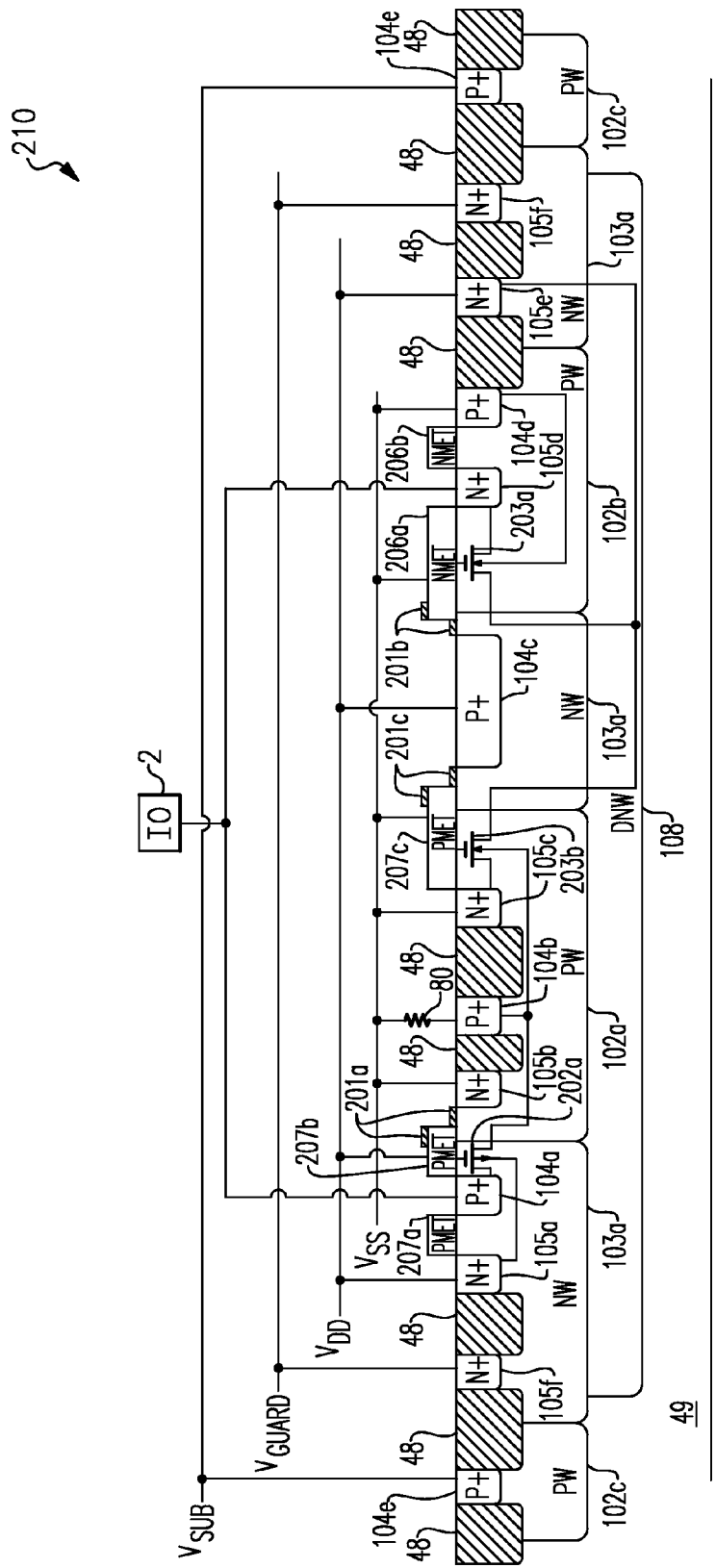
FIG. 8B is a cross section of a protection device according to another embodiment.

FIG. 8B is a cross section of a protection device 210 according to another embodiment.

The protection device 210 of FIG. 8B is similar to the protection device 200 of FIG. 8A, except that the protection device 210 illustrates a configuration including a third RPO region 201*c* and in which the third PMET gate region 207*c* is electrically connected to the power low supply $V_{SS}$. As shown in FIG. 8B, the third RPO region 201*c* is disposed over a portion of the third PMET gate region 207*c* and over a surface of the central region of the n-well 103*a* between the third PMET gate region 207*c* and the third P+ region 104*c*.

Configuring the protection device 210 in this manner can prevent formation of the second PMOS transistor 202*b* shown in FIG. 8A, and can reduce leakage current of the second NMOS transistor 203*b* during normal signaling conditions. The illustrated configuration can be used, for example, in applications having low standing current specifications between power high and power low supplies. However, configuring the protection device 210 in this manner can also reduce the device's current handling capability and/or turn-on speed for ESD events received between the power low supply $V_{SS}$ and the power high supply $V_{DD}$. Additional details of the protection device 210 of FIG. 8B can similar to those described earlier.

Figure 9A:
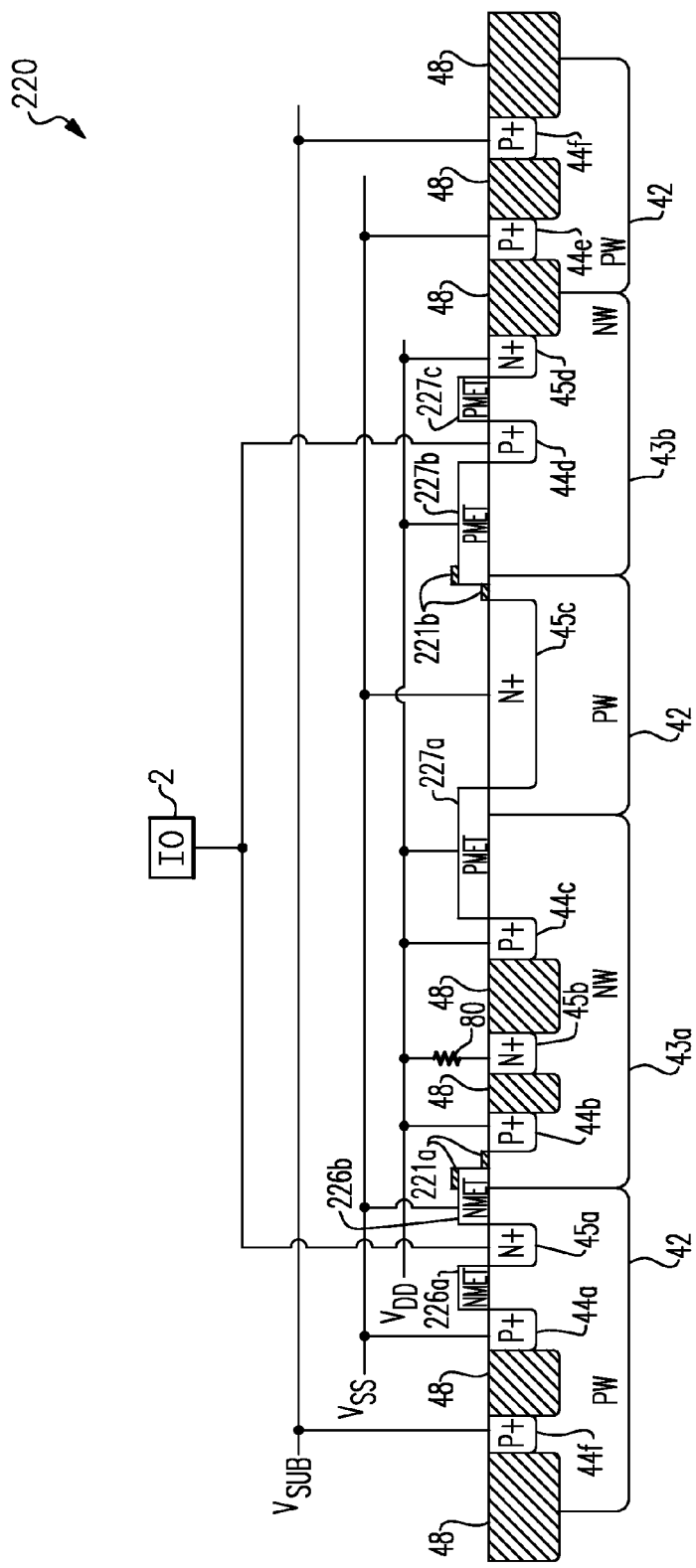
FIG. 9A is a cross section of a protection device according to another embodiment.

FIG. 9A is a cross section of a protection device 220 according to another embodiment. The protection device 220 includes first and second n-wells 43a, 43b, first to sixth p-type diffusion or P+ regions 44a-44f, first to fourth n-type diffusion or N+ regions 45a-45d, first and second NMET gate regions 226a, 226b, first to third PMET gate regions 227a-227c, oxide regions 48, and first and second RPO regions 221a, 221b. The illustrated protection device 220 is fabricated in the p-type substrate 49.

The protection device 220 of FIG. 9A is similar to the protection device 40 of FIGS. 2A-2C, except that the protection device 220 includes a different arrangement of gate regions and RPO regions. The arrangement of gate and RPO regions is similar to the arrangement shown in FIG. 8A, but with polarity reversed.

For example, as shown in FIG. 9A, the first NMET gate region 226a is positioned over the left region of the p-well 42 and extends between the first P+ region 44a and the first N+ region 45a. Additionally, the second NMET gate region 226b is positioned over a boundary between the first n-well 43a and the left region of the p-well 42, and extends from the first N+ region 45a toward the second P+ region 44b. As shown in FIG. 9A, the first RPO region 221a is disposed over a portion of the second NMET gate region 226b and over a surface of the first n-well 43a between the second NMET gate region 226b and the second P+ region 44b. Additionally, the first PMET gate region 227a is positioned over a boundary between the first n-well 43a and the central region of the p-well 42, and extends between the third P+ region 44c and the third N+ region 45c. Furthermore, the second PMET gate region 227b is positioned over a boundary between the second n-well 43b and the central region of the p-well 42, and extends from the fourth P+ region 44d toward the third N+ region 45c. As shown in FIG. 9A, the second RPO region 221b is disposed over a portion of the second PMET gate region 227b and over a surface of the central region of the p-well 42 between the second PMET gate region 227b and the third N+ region 45c. Additionally, the third PMET gate region 227c is positioned over the second n-well 43b, and extends between the fourth P+ region 44d and the fourth N+ region 45d. In the illustrated configuration, the first NMET gate region 226a and the third PMET gate region 227c are electrically floating. Additionally, the first PMET gate region 227a and the second PMET gate region 227b are electrically connected to the power high supply $V_{DD}$, and the second NMET gate region 226b is electrically connected to the power low supply $V_{SS}$.

Additional details of the protection device 220 can be similar to those described earlier.

Figure 9B:
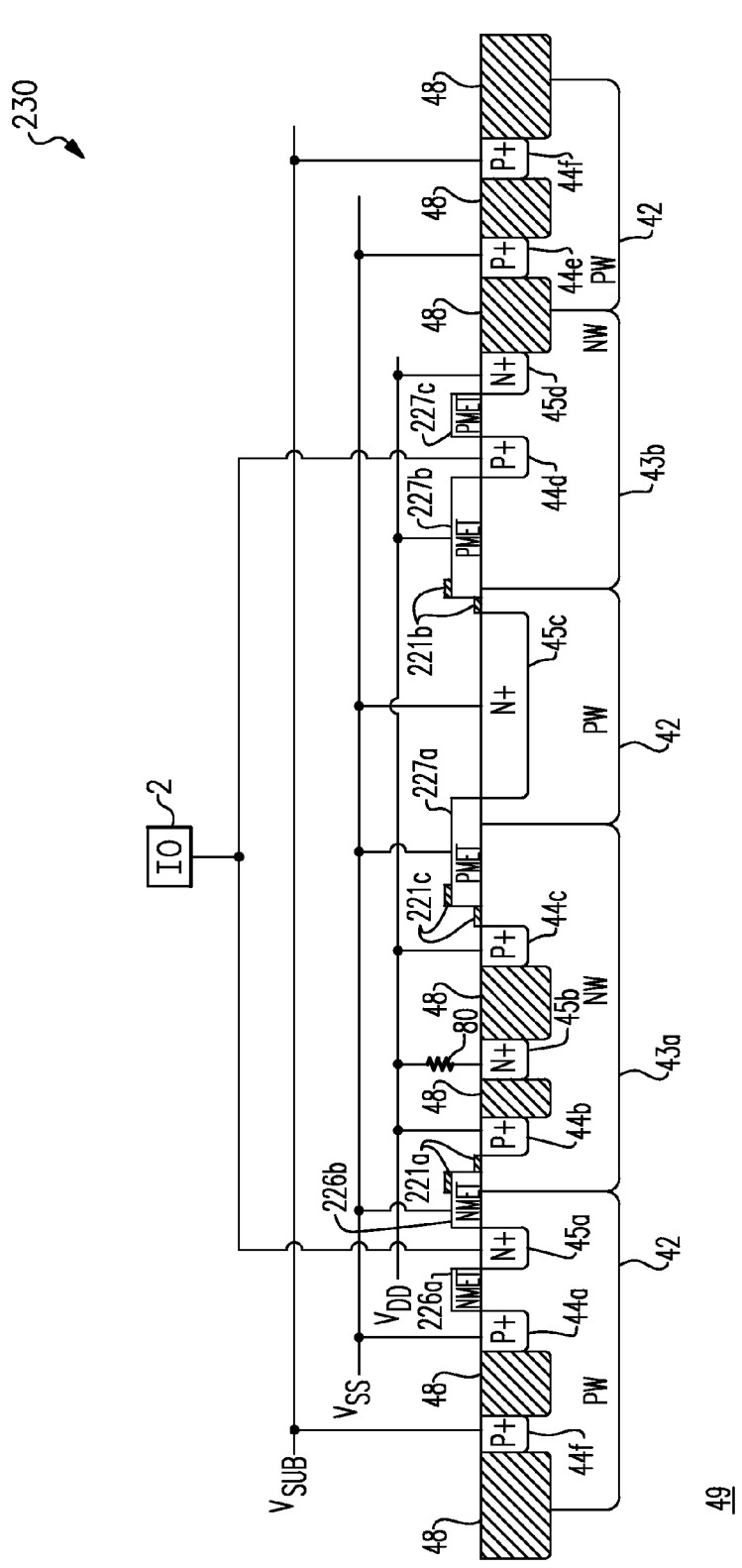
FIG. 9B is a cross section of a protection device according to another embodiment.

FIG. 9B is a cross section of a protection device 230 according to another embodiment. The protection device 230 of FIG. 9B is similar to the protection device 220 of FIG. 9A, except that the protection device 230 illustrates a configuration including a third RPO region 221c and in which the first PMET gate region 227a is electrically connected to the power low supply $V_{SS}$. As shown in FIG. 9B, the third RPO region 221c is disposed over a portion of the first PMET gate region 227a and over a surface of the first n-well 43a between the first PMET gate region 227a and the third P+ region 44c.

Additional details of the protection device 230 can be similar to those described earlier.

Figure 10A:
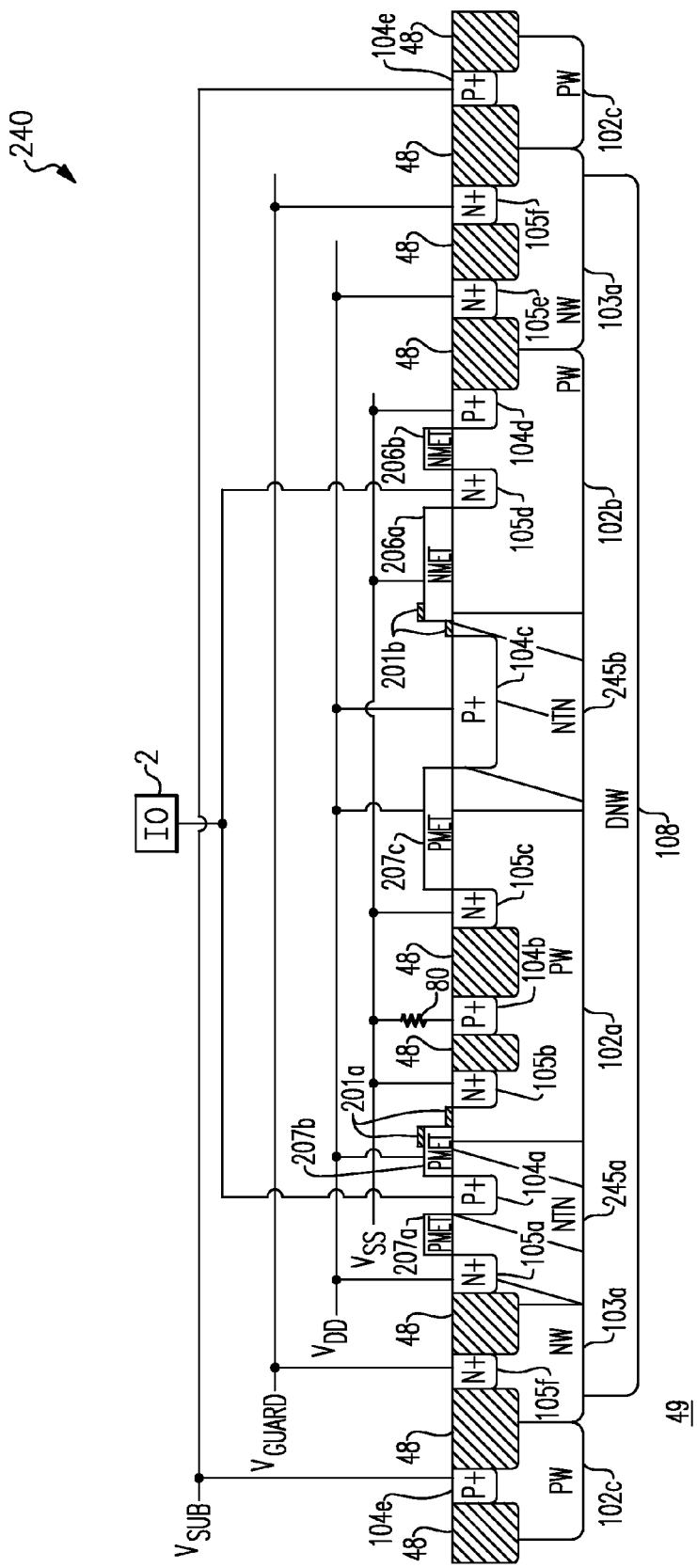
FIG. 10A is a cross section of a protection device according to another embodiment.

FIG. 10A is a cross section of a protection device 240 according to another embodiment. The protection device 240 includes the n-well 103a, first to third p-wells 102a-102c, the deep n-well 108, first and second RPO regions 201a, 201b, first to fifth P+ regions 104a-104e, first to sixth N+ regions 105a-105f, first and second NMET gate regions 206a, 206b, first to third PMET gate regions 207a-207c, oxide regions 48, and first and second n-type native regions 245a, 245b. The protection device 240 is fabricated in the p-type substrate 49.

The protection device 240 of FIG. 10A is similar to the protection device 200 of FIG. 8A, except that the protection device 240 includes the first and second n-type native regions 245a, 245b.

In certain fabrication processes, a native or NTN implant blocking region can be used to block well implants during fabrication. For example, in one embodiment, the NTN implant blocking region can be used to block implants associated with doping n-wells and p-wells, such as the n-well 103a and the first to third p-wells 102a-102c. Use of the NTN implant blocking region can result in the formation of native regions, which have a doping corresponding to a background doping concentration. For example, in the illustrated configuration, the first and second n-type native regions 245a, 245b can have an n-type doping corresponding to a background doping concentration or profile associated with formation of the deep n-well 108. After formation of native regions, the NTN implant blocking region can be removed and may not be present after the protection device is fabricated.

As shown in FIG. 10A, the first N+ region 105a and the first P+ region 104a are disposed in the first n-type native region 245a. Additionally, the first PMET gate region 207a is positioned over the first n-type native region 245a between the first N+ region 105a and the first P+ region 104a. Furthermore, the second PMET gate region 207b is positioned over a boundary between the first n-type native region 245a and the first p-well 102a, and extends from the first P+ region 104a toward the second N+ region 105b. Furthermore, the third P+ region 104c is disposed in the second n-type native region 245b. Additionally, the third PMET gate region 207c is positioned over a boundary between the second n-type native region 245b and the first p-well 102a, and extends between the third P+ region 104c and the third N+ region 105c. Furthermore, the first NMET gate region 206a is positioned over a boundary between the second n-type native region 245b and the second p-well 102b, and extends from the fourth N+ region 105d toward the third P+ region 104c. The second RPO region 201b includes a first portion over the first NMET gate region 206a and a second portion over a surface of the second n-type native region 245b between the third P+ region 104c and the first NMET gate region 206a.

Including the first and second n-type native regions 245a, 245b in the protection device 240 can reduce a parasitic capacitance of the device relative to a configuration using wells rather than native regions. Additional details of the protection device 240 can be similar to those described earlier.

Figure 10B:
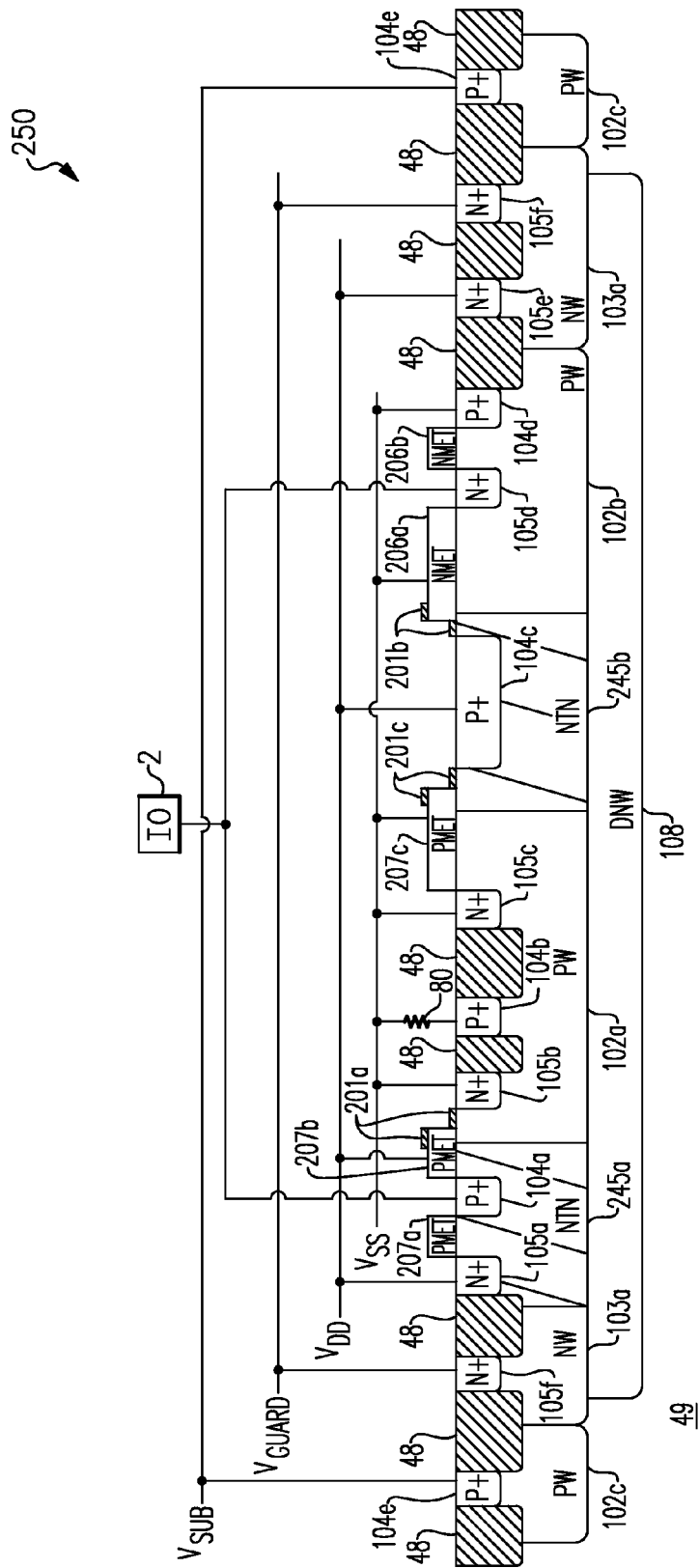
FIG. 10B is a cross section of a protection device according to another embodiment.

FIG. 10B is a cross section of a protection device 250 according to another embodiment. The protection device 250 of FIG. 10B is similar to the protection device 240 of FIG. 10A, except that the protection device 250 illustrates a configuration including a third RPO region 201c and in which the third PMET gate region 207c is electrically connected to the power low supply $V_{SS}$. As shown in FIG. 10B, the third RPO region 201c is disposed over a portion of the third PMET gate region 207c and over a surface of the second n-type native region 245b between the third PMET gate region 207c and the third P+ region 104c.

Additional details of the protection device 250 can be similar to those described earlier.

Figure 11A:
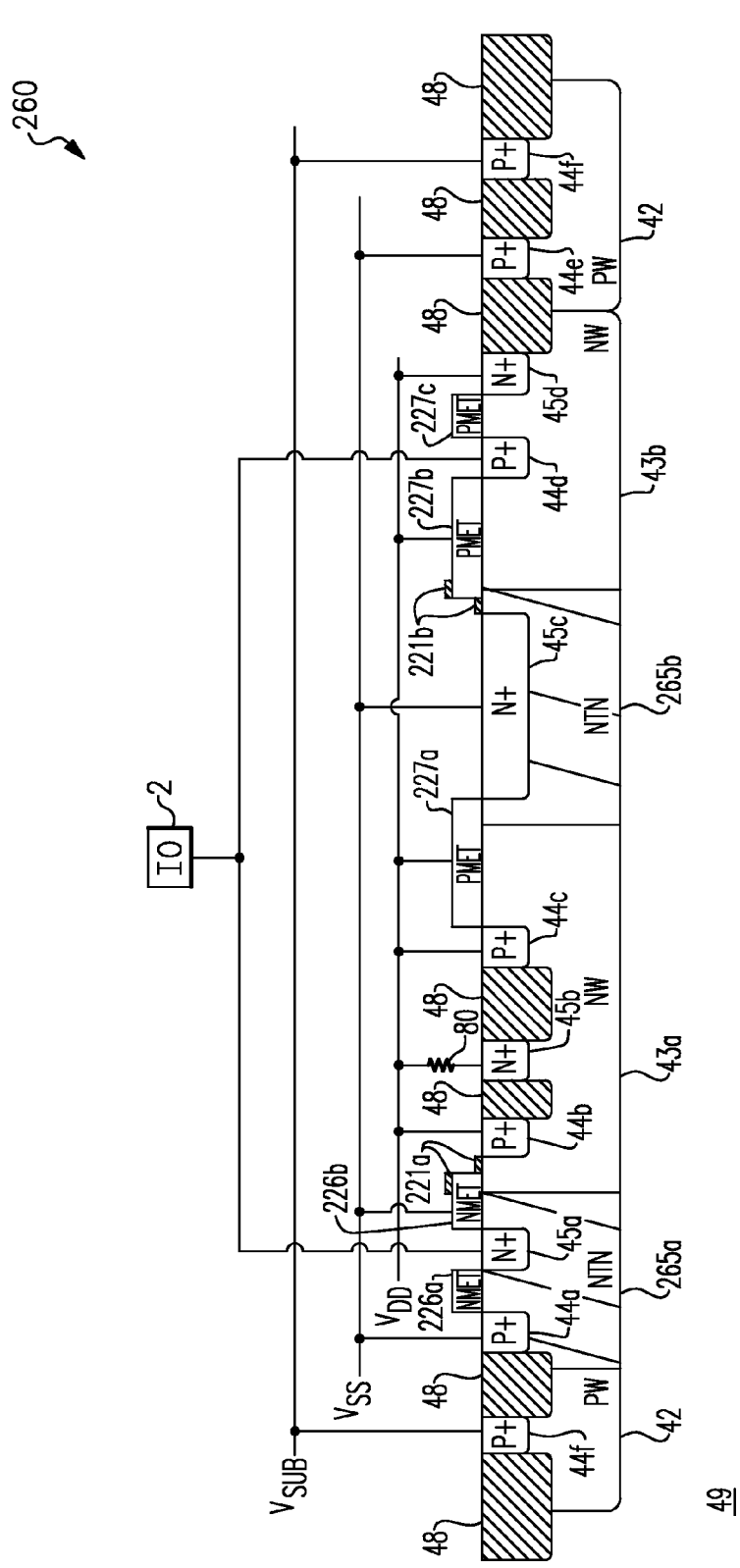
FIG. 11A is a cross section of a protection device according to another embodiment.

FIG. 11A is a cross section of a protection device 260 according to another embodiment. The protection device 260 includes first and second n-wells 43a, 43b, first to sixth p-type diffusion or P+ regions 44a-44f, first to fourth n-type diffusion or N+ regions 45a-45d, first and second NMET gate regions 226a, 226b, first to third PMET gate regions 227a-227c, oxide regions 48, first and second RPO regions 221a, 221b, and first and second p-type native regions 265a, 265b. The illustrated protection device 260 is fabricated in the p-type substrate 49.

The protection device 260 of FIG. 11A is similar to the protection device 220 of FIG. 9A, except that the protection device 260 includes the first and second p-type native regions 265a, 265b.

As described earlier, in certain fabrication processes, an NTN implant blocking region can be used to block well implants during fabrication. The NTN implant blocking region can be used to block implants associated with doping n-wells and p-wells, such as the p-well 42 first and second n-wells 43a, 43b. Use of the NTN implant blocking region can result in the formation of native regions, which have a doping corresponding to a background doping concentration. For example, in the illustrated configuration, the first and second p-type native regions 265a, 265b can have a p-type doping corresponding to a background doping concentration or profile associated with doping of the p-type substrate 49. After formation of native regions, the NTN implant blocking region can be removed and may not be present after the protection device is fabricated.

As shown in FIG. 11A, the first P+ region 44a and the first N+ region 45a are disposed in the first p-type native region 265a. Additionally, the first NMET gate region 226a is positioned over the first p-type native region 265a between the first P+ region 44a and the first N+ region 45a. Furthermore, the second NMET gate region 226b is positioned over a boundary between the first p-type native region 265a and the first n-well 43a, and extends from the first N+ region 45a toward the second P+ region 44b. Furthermore, the third N+ region 45c is disposed in the second p-type native region 265b. Additionally, the first PMET gate region 227a is positioned over a boundary between the second p-type native region 265b and the first n-well 43a, and extends between the third N+ region 45c and the third P+ region 44c. Furthermore, the first PMET gate region 227a is positioned over a boundary between the second p-type native region 265b and the second n-well 43b, and extends from the fourth P+ region 44d toward the third N+ region 45c. The second RPO region 221b includes a first portion over the second PMET gate region 227b and a second portion over a surface of the second p-type native region 265b between the third N+ region 45c and the second PMET gate region 227b.

Including the first and second p-type native regions 265a, 265b in the protection device 260 can reduce a parasitic capacitance of the device relative to a configuration using wells rather than native regions. Additional details of the protection device 260 can be similar to those described earlier.

Figure 11B:
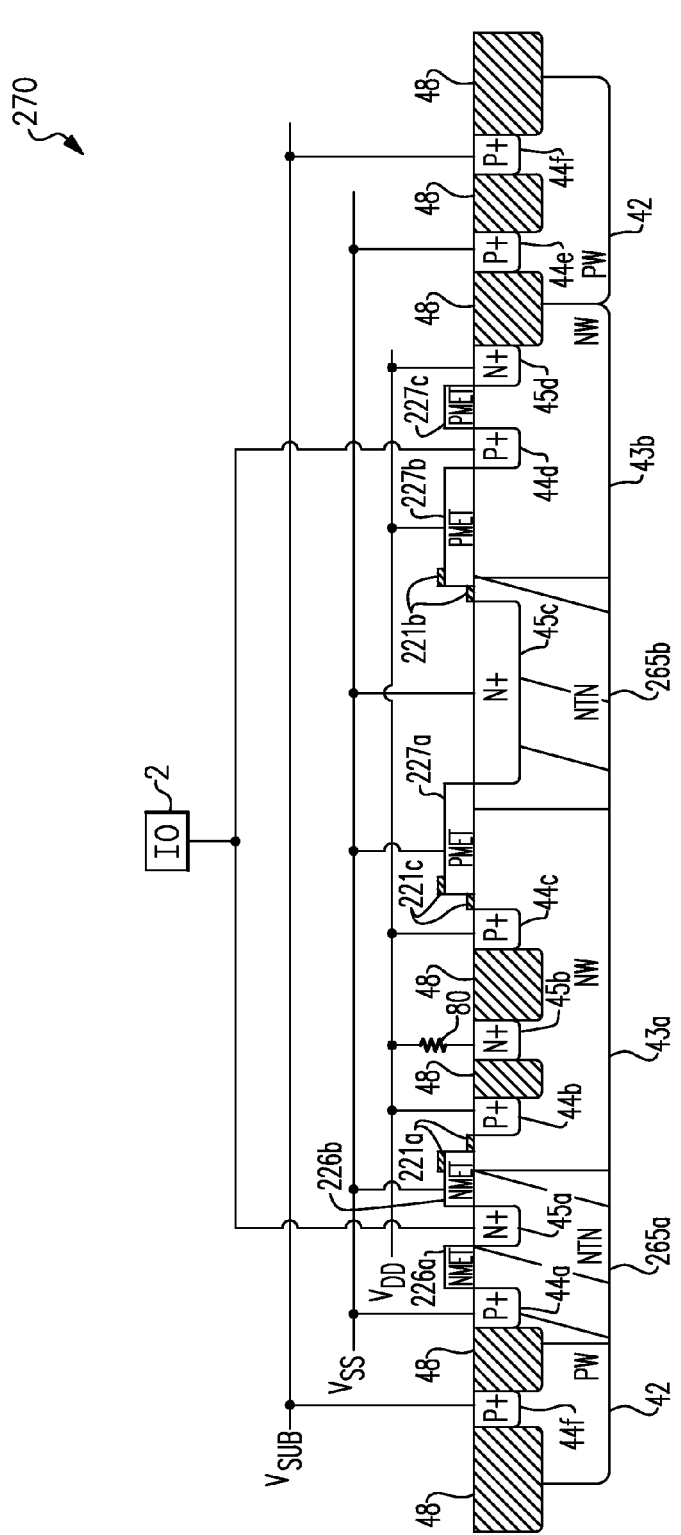
FIG. 11B is a cross section of a protection device according to another embodiment.

FIG. 11B is a cross section of a protection device 270 according to another embodiment. The protection device 270 of FIG. 11B is similar to the protection device 260 of FIG. 11A, except that the protection device 270 illustrates a configuration including a third RPO region 221c and in which the first PMET gate region 227a is electrically connected to the power low supply $V_{SS}$. As shown in FIG. 11B, the third RPO region 221c is disposed over a portion of the first PMET gate region 227a and over a surface of the second p-type native region 265b between the first PMET gate region 227a and the third P+ region 44c.

Additional details of the protection device 270 can be similar to those described earlier.

Applications

Devices employing the above described protection schemes can be implemented into various electronic devices and interface applications. Examples of the electronic devices can include, but are not limited to, consumer electronic products, parts of the consumer electronic products, electronic test equipment as well as high robustness industrial and automotive applications, among other applications in the semiconductor industry. Examples of the electronic devices can also include circuits of optical networks or other communication networks and circuits for voltage reference and electrical cars battery power management. The electronic products can include, power management integrated circuits for cell phones, base stations, a vehicle engine management controller, a transmission controller, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a substrate;
   a first semiconductor region of a first doping type in the substrate, wherein the first semiconductor region comprises a first well region;
   a second semiconductor region of a second doping type in the substrate, wherein the second semiconductor region comprises a second well region;
   a third semiconductor region of the first doping type in the substrate, wherein the third semiconductor region comprises a third well region, wherein the second semiconductor region is positioned between the first and third semiconductor regions;
   a fourth semiconductor region of the second doping type in the substrate, wherein the fourth semiconductor region comprises a fourth well region, wherein the third semiconductor region is positioned between the second and fourth semiconductor regions;
a fifth well region of the first doping type in the substrate, wherein the fourth well region is positioned between the third and fifth well regions;
a first diffusion region of the second type in the first semiconductor region;
a first gate region adjacent the first semiconductor region;
a second diffusion region of the first type in the second semiconductor region;
a third diffusion region of the first type in the second semiconductor region;
a fourth diffusion region of the second type in the third semiconductor region;
a fifth diffusion region of the first type in the fourth semiconductor region; and
a second gate region adjacent the fourth semiconductor region;
a signal node electrically connected to the first and fifth diffusion regions;
a first power supply node electrically connected to the second and third diffusion regions; and
a second power supply node electrically connected to the fourth diffusion region;
wherein the second diffusion region, the second semiconductor region, the first semiconductor region, and the first diffusion region are configured as a first silicon controlled rectifier (SCR);
wherein the third diffusion region, the second semiconductor region, the third semiconductor region, and the fourth diffusion region are configured as a second SCR;
wherein the fifth diffusion region, the fourth semiconductor region, the third semiconductor region and the fourth diffusion region are configured as a third SCR;
wherein a junction between the first well region and the first diffusion region is configured as a first diode;
wherein a junction between the fifth diffusion region and the fourth well region is configured a second diode; and
wherein a junction between the fifth well region and the fourth well region is configured as a third diode.

2. The apparatus of claim 1, further comprising:
a third gate region adjacent a boundary between the first and second well regions;
a fourth gate region adjacent a boundary between the second and third well regions; and
a fifth gate region adjacent a boundary between the third and fourth well regions.

3. The apparatus of claim 2, wherein the third gate region comprises metal associated with the first type, the fourth gate region comprises metal associated with the second type, and the fifth gate region comprises metal associated with the second type.

4. The apparatus of claim 3, wherein the third gate region is electrically connected to the first power supply node, wherein the fourth gate region is electrically connected to the second power supply node, and wherein the fifth gate region is electrically connected to the second power supply node.

5. The apparatus of claim 3, further comprising:
a first resist protection oxide (RPO) region, wherein at least a portion of the first RPO region is positioned between the first diffusion region and the third gate region;
a second RPO region, wherein at least a portion of the second RPO region is positioned between the third diffusion region and the fourth gate region; and
a third RPO region, wherein at least a portion of the third RPO region is positioned between the fifth diffusion region and the fifth gate region.

6. The apparatus of claim 1, further comprising:
a sixth diffusion region of the first type in the first well region and electrically connected to the second power supply node;
a seventh diffusion region of the second type in the second well region and electrically connected to the first power supply node;
an eighth diffusion region of the second type in the fourth well region and electrically connected to the first power supply node; and
a ninth diffusion region of the first type in the fifth well region and electrically connected to the second power supply node.

7. The apparatus of claim 6,
wherein the first gate region is positioned between the first and sixth diffusion regions; and
wherein the second gate region is positioned between the fifth and eighth diffusion regions.

8. The apparatus of claim 7, wherein the first gate region comprises metal associated with the second type and the second gate region comprises metal associated with the first type.

9. The apparatus of claim 7, wherein the first and second gate regions are electrically floating.

10. The apparatus of claim 6, further comprising an explicit resistor electrically connected between the seventh diffusion region and the first power supply node.

11. The apparatus of claim 2, wherein the third gate region comprises metal associated with the second type, the fourth gate region comprises metal associated with p-type, and the fifth gate region comprises metal associated with the first type.

12. The apparatus of claim 11, wherein the third gate region is electrically connected to the second power supply node, and wherein the fifth gate region is electrically connected to the first power supply node.

13. The apparatus of claim 12, further comprising:
a first RPO region, wherein at least a portion of the first RPO region is positioned between the second diffusion region and the third gate region;
a second RPO region, wherein at least a portion of the second RPO region is positioned between the fourth diffusion region and the fifth gate region.

14. The apparatus of claim 13, wherein the fourth gate region is electrically connected to a power high supply node.

15. The apparatus of claim 13, wherein the first type is n-type and the second type is p-type, wherein the apparatus further comprises a third RPO region, wherein at least a portion of the third RPO region is positioned between the fourth diffusion region and the fourth gate region, wherein the fourth gate region is electrically connected to a power low supply node.

16. The apparatus of claim 13, wherein the first type is p-type and the second type is n-type, wherein the apparatus further comprises a third RPO region, wherein at least a portion of the third RPO region is positioned between the third diffusion region and the fourth gate region, wherein the fourth gate region is electrically connected to a power low supply node.

17. The apparatus of claim 1, wherein the first type is p-type and the second type is n-type.

18. The apparatus of claim 1, wherein the first type is n-type and the second type is p-type, wherein the apparatus further comprises:

a deep well region of the first type disposed beneath the second well region, the third well region, the fourth well region, and at least a portion of the first and fifth well regions.

19. The apparatus of claim 1, wherein the first semiconductor region comprises a first native region, wherein the second semiconductor region comprises a first well region, wherein the third semiconductor region comprises a second native region, and wherein the fourth semiconductor region comprises a fourth well region.

20. A method of manufacturing a protection device, the method comprising:
- forming a first semiconductor region of a first doping type in a substrate, wherein the first semiconductor region comprises a first well region;
- forming a second semiconductor region of a second doping type in the substrate, wherein the second semiconductor region comprises a second well region;
- forming a third semiconductor region of the first doping type in the substrate, wherein the third semiconductor region comprises a third well region, wherein the second semiconductor region is positioned between the first and third semiconductor regions;
- forming a fourth semiconductor region of the second doping type in the substrate, wherein the fourth semiconductor region comprises a fourth well region, wherein the third semiconductor region is positioned between the second and fourth semiconductor regions;
- forming a fifth well region of the first doping type in the substrate, wherein the fourth well region is positioned between the third and fifth well regions;
- forming a first diffusion region of the second type in the first semiconductor region;
- forming a first gate region adjacent the first semiconductor region;
- forming a second diffusion region of the first type in the second semiconductor region;
- forming a third diffusion region of the first type in the second semiconductor region;
- forming a fourth diffusion region of the second type in the third semiconductor region;
- forming a fifth diffusion region of the first type in the fourth semiconductor region;
- forming a second gate region adjacent the fourth semiconductor region;
- forming a signal node electrically connected to the first and fifth diffusion regions;
- forming a first power supply node electrically connected to the second and third diffusion regions; and
- forming a second power supply node electrically connected to the fourth diffusion region;
- wherein the second diffusion region, the second semiconductor region, the first semiconductor region and the first diffusion region are configured as a first silicon controlled rectifier (SCR);
- wherein the third diffusion region, the second semiconductor region, the third semiconductor region, and the fourth diffusion region are configured as a second SCR;
- wherein the fifth diffusion region, the fourth semiconductor region, the third semiconductor region and the fourth diffusion region are configured as a third SCR;
- wherein a junction between the first well region and the first diffusion region is configured as a first diode;
- wherein a junction between the fifth diffusion region and the fourth well region is configured as a second diode; and
- wherein a junction between the fifth well region and the fourth well region is configured as a third diode.

* * * * *

UNITED STATES PATENT AND TRADEMARK OFFICE
CERTIFICATE OF CORRECTION

| | | |
|---|---|---|
| PATENT NO. | : 9,006,781 B2 | Page 1 of 1 |
| APPLICATION NO. | : 14/068869 | |
| DATED | : April 14, 2015 | |
| INVENTOR(S) | : Javier Alejandro Salcedo et al. | |

It is certified that error appears in the above-identified patent and that said Letters Patent is hereby corrected as shown below:

IN THE SPECIFICATION

In column 13 at line 52, Change "reversed" to --reversed.--.

In column 14 at line 63, Change "and or" to --and/or--.

IN THE CLAIMS

In column 21 at line 38, In Claim 1, change "configured a" to --configured as a--.

In column 24 at line 18, In Claim 20, change "region" to --region,--.

Signed and Sealed this
Fifth Day of January, 2016

Michelle K. Lee
*Director of the United States Patent and Trademark Office*